(12) United States Patent
Delmas et al.

(10) Patent No.: US 11,694,912 B2
(45) Date of Patent: *Jul. 4, 2023

(54) HIGH PRESSURE AND HIGH TEMPERATURE ANNEAL CHAMBER

(71) Applicant: Applied Materials, Inc., Santa Clara, CA (US)

(72) Inventors: Jean Delmas, Santa Clara, CA (US); Steven Verhaverbeke, San Francisco, CA (US); Kurtis Leschkies, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 37 days.

This patent is subject to a terminal disclaimer.

(21) Appl. No.: 17/329,948

(22) Filed: May 25, 2021

(65) Prior Publication Data

US 2022/0013375 A1   Jan. 13, 2022

Related U.S. Application Data

(60) Continuation of application No. 16/378,140, filed on Apr. 8, 2019, now Pat. No. 11,018,032, which is a
(Continued)

(51) Int. Cl.
*H01L 21/67* (2006.01)
*F27B 9/36* (2006.01)
(Continued)

(52) U.S. Cl.
CPC .......... *H01L 21/67109* (2013.01); *F27B 9/36* (2013.01); *H01L 21/324* (2013.01);
(Continued)

(58) Field of Classification Search
CPC .................. H01L 21/67109; H01L 45/00
See application file for complete search history.

(56) References Cited

U.S. PATENT DOCUMENTS 3,684,592 A   8/1972  Chang et al.
3,749,383 A   7/1973  Voigt et al.
(Continued)

FOREIGN PATENT DOCUMENTS

CN   1280875 C    10/2006
CN   101871043 A  10/2010
(Continued)

OTHER PUBLICATIONS

Taiwan Office Action for Taiwan Patent Application No. 107125291 dated Mar. 3, 2022.
(Continued)

*Primary Examiner* — Mounir S Amer
(74) *Attorney, Agent, or Firm* — Patterson + Sheridan, LLP

(57) ABSTRACT

Embodiments of the disclosure relate to an apparatus and method for annealing one or more semiconductor substrates. In one embodiment, a processing chamber is disclosed. The processing chamber includes a chamber body enclosing an internal volume, a substrate support disposed in the internal volume and configured to support a substrate during processing, a gas panel configured to provide a processing fluid into the internal volume, and a temperature-controlled fluid circuit configured to maintain the processing fluid at a temperature above a condensation point of the processing fluid. The temperature-controlled fluid circuit includes a gas conduit fluidly coupled to a port on the chamber body at a first end and to the gas panel at a second end.

20 Claims, 3 Drawing Sheets

Related U.S. Application Data division of application No. 15/681,317, filed on Aug. 18, 2017, now Pat. No. 10,276,411.

(51) Int. Cl.
*H01L 21/677* (2006.01)
*H01L 21/324* (2006.01)

(52) U.S. Cl.
CPC .... *H01L 21/67017* (2013.01); *H01L 21/6719* (2013.01); *H01L 21/67248* (2013.01); *H01L 21/67754* (2013.01); *H01L 21/67748* (2013.01)

(56) References Cited

U.S. PATENT DOCUMENTS

| | | |
|---|---|---|
| 3,758,316 A | 9/1973 | Sowards et al. |
| 4,409,260 A | 10/1983 | Pastor et al. |
| 4,424,101 A | 1/1984 | Nowicki |
| 4,524,587 A | 6/1985 | Kantor |
| 4,576,652 A | 3/1986 | Hovel et al. |
| 4,589,193 A | 5/1986 | Goth et al. |
| 4,879,259 A | 11/1989 | Reynolds et al. |
| 5,050,540 A | 9/1991 | Lindberg |
| 5,114,513 A | 5/1992 | Hosokawa et al. |
| 5,126,117 A | 6/1992 | Schumacher et al. |
| 5,149,378 A | 9/1992 | Ohmi et al. |
| 5,167,717 A | 12/1992 | Boitnott |
| 5,175,123 A | 12/1992 | Vasquez et al. |
| 5,217,757 A | 6/1993 | Olson et al. |
| 5,300,320 A | 4/1994 | Barron et al. |
| 5,314,541 A | 5/1994 | Saito et al. |
| 5,319,212 A | 6/1994 | Tokoro |
| 5,366,905 A | 11/1994 | Mukai |
| 5,472,812 A | 12/1995 | Sekine |
| 5,503,874 A | 4/1996 | Ackerman et al. |
| 5,578,132 A | 11/1996 | Yamaga et al. |
| 5,590,695 A | 1/1997 | Siegele et al. |
| 5,597,439 A | 1/1997 | Salzman |
| 5,620,524 A | 4/1997 | Fan et al. |
| 5,677,230 A | 10/1997 | Weitzel et al. |
| 5,747,383 A | 5/1998 | Chen et al. |
| 5,808,245 A | 9/1998 | Wiese et al. |
| 5,857,368 A | 1/1999 | Grunes et al. |
| 5,858,051 A | 1/1999 | Komiyama et al. |
| 5,877,087 A | 3/1999 | Mosely et al. |
| 5,879,756 A | 3/1999 | Fathi et al. |
| 5,880,041 A | 3/1999 | Ong |
| 5,886,864 A | 3/1999 | Dvorsky |
| 5,888,888 A | 3/1999 | Talwar et al. |
| 5,918,149 A | 6/1999 | Besser et al. |
| 5,940,985 A | 8/1999 | Kamikawa et al. |
| 5,950,925 A | 9/1999 | Fukunaga et al. |
| 6,042,898 A | 3/2000 | Burns et al. |
| 6,071,810 A | 6/2000 | Wada et al. |
| 6,077,571 A | 6/2000 | Kaloyeros |
| 6,082,950 A | 7/2000 | Altwood et al. |
| 6,086,730 A | 7/2000 | Liu |
| 6,103,585 A | 8/2000 | Michaelis |
| 6,136,664 A | 10/2000 | Economikos et al. |
| 6,140,235 A | 10/2000 | Yao et al. |
| 6,150,286 A | 11/2000 | Sun et al. |
| 6,156,382 A | 12/2000 | Rajagopalan et al. |
| 6,162,715 A | 12/2000 | Mak et al. |
| 6,164,412 A | 12/2000 | Allman |
| 6,207,487 B1 | 3/2001 | Kim et al. |
| 6,242,368 B1 | 6/2001 | Holmer et al. |
| 6,242,808 B1 | 6/2001 | Shimizu et al. |
| 6,245,192 B1 | 6/2001 | Dhindsa et al. |
| 6,251,242 B1 | 6/2001 | Fu et al. |
| 6,251,751 B1 | 6/2001 | Chu et al. |
| 6,277,249 B1 | 8/2001 | Gopalraja et al. |
| 6,284,646 B1 | 9/2001 | Leem |
| 6,299,753 B1 | 10/2001 | Chao et al. |
| 6,305,314 B1 | 10/2001 | Sneh et al. |
| 6,309,713 B1 | 10/2001 | Mak et al. |
| 6,319,766 B1 | 11/2001 | Bakli et al. |
| 6,319,847 B1 | 11/2001 | Ishikawa |
| 6,332,926 B1 | 12/2001 | Pfaendtner et al. |
| 6,334,249 B2 | 1/2002 | Hsu |
| 6,334,266 B1 | 1/2002 | Moritz et al. |
| 6,335,240 B1 | 1/2002 | Kim et al. |
| 6,344,249 B1 | 2/2002 | Maruyama et al. |
| 6,344,419 B1 | 2/2002 | Forster et al. |
| 6,348,376 B2 | 2/2002 | Lim et al. |
| 6,355,558 B1 | 3/2002 | Dixit |
| 6,358,829 B2 | 3/2002 | Yoon et al. |
| 6,359,089 B2 | 3/2002 | Hung et al. |
| 6,368,412 B1 | 4/2002 | Gomi |
| 6,372,598 B2 | 4/2002 | Kang et al. |
| 6,379,466 B1 | 4/2002 | Sahin et al. |
| 6,387,764 B1 | 5/2002 | Curtis et al. |
| 6,399,486 B1 | 6/2002 | Chen et al. |
| 6,399,491 B2 | 6/2002 | Jeon et al. |
| 6,402,898 B1 | 6/2002 | Brumer et al. |
| 6,416,822 B1 | 7/2002 | Chiang et al. |
| 6,428,859 B1 | 8/2002 | Chiang et al. |
| 6,437,066 B1 | 8/2002 | Hung et al. |
| 6,442,980 B2 | 9/2002 | Preston et al. |
| 6,451,119 B2 | 9/2002 | Sneh et al. |
| 6,451,695 B2 | 9/2002 | Sneh |
| 6,458,701 B1 | 10/2002 | Chae et al. |
| 6,464,779 B1 | 10/2002 | Powell et al. |
| 6,468,490 B1 | 10/2002 | Shamouilian et al. |
| 6,468,924 B2 | 10/2002 | Lee et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,489,214 B2 | 12/2002 | Kim et al. |
| 6,500,603 B1 | 12/2002 | Shioda |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,583,497 B2 | 6/2003 | Xia et al. |
| 6,585,823 B1 | 7/2003 | Van Wijck |
| 6,599,572 B2 | 7/2003 | Saanila et al. |
| 6,599,819 B1 | 7/2003 | Goto |
| 6,607,976 B2 | 8/2003 | Chen et al. |
| 6,619,304 B2 | 9/2003 | Worm |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,630,244 B1 | 10/2003 | Mao et al. |
| 6,632,279 B1 | 10/2003 | Ritala et al. |
| 6,657,304 B1 | 12/2003 | Woo et al. |
| 6,660,660 B2 | 12/2003 | Haukka et al. |
| 6,677,247 B2 | 1/2004 | Yuan et al. |
| 6,686,271 B2 | 2/2004 | Raaijmakers et al. |
| 6,740,585 B2 | 5/2004 | Yoon et al. |
| 6,780,777 B2 | 8/2004 | Yun et al. |
| 6,784,096 B2 | 8/2004 | Chen et al. |
| 6,797,336 B2 | 9/2004 | Garvey et al. |
| 6,797,340 B2 | 9/2004 | Fang et al. |
| 6,805,750 B1 | 10/2004 | Ristau et al. |
| 6,809,026 B2 | 10/2004 | Yoon et al. |
| 6,811,814 B2 | 11/2004 | Chen et al. |
| 6,821,891 B2 | 11/2004 | Chen et al. |
| 6,825,115 B1 | 11/2004 | Xiang et al. |
| 6,825,134 B2 | 11/2004 | Law et al. |
| 6,827,978 B2 | 12/2004 | Yoon et al. |
| 6,831,021 B2 | 12/2004 | Chua et al. |
| 6,833,161 B2 | 12/2004 | Wang et al. |
| 6,838,125 B2 | 1/2005 | Chung et al. |
| 6,841,432 B1 | 1/2005 | Takemura et al. |
| 6,846,516 B2 | 1/2005 | Yang et al. |
| 6,849,122 B1 | 2/2005 | Fair |
| 6,867,130 B1 | 3/2005 | Karlsson et al. |
| 6,867,152 B1 | 3/2005 | Hausmann et al. |
| 6,869,838 B2 | 3/2005 | Law et al. |
| 6,872,429 B1 | 3/2005 | Chen et al. |

(56) References Cited

U.S. PATENT DOCUMENTS

| | | |
|---|---|---|
| 6,889,627 B1 | 5/2005 | Hao |
| 6,897,118 B1 | 5/2005 | Poon et al. |
| 6,905,939 B2 | 6/2005 | Yuan et al. |
| 6,911,391 B2 | 6/2005 | Yang et al. |
| 6,924,191 B2 | 8/2005 | Liu et al. |
| 6,936,538 B2 | 8/2005 | Byun |
| 6,939,801 B2 | 9/2005 | Chung et al. |
| 6,939,804 B2 | 9/2005 | Lai et al. |
| 6,951,804 B2 | 10/2005 | Seutter et al. |
| 6,969,448 B1 | 11/2005 | Lau |
| 6,972,267 B2 | 12/2005 | Cao et al. |
| 7,026,238 B2 | 4/2006 | Xi et al. |
| 7,041,335 B2 | 5/2006 | Chung |
| 7,049,226 B2 | 5/2006 | Chung et al. |
| 7,055,333 B2 | 6/2006 | Leitch et al. |
| 7,081,271 B2 | 7/2006 | Chung et al. |
| 7,084,079 B2 | 8/2006 | Conti et al. |
| 7,101,795 B1 | 9/2006 | Xi et al. |
| 7,105,061 B1 | 9/2006 | Shrinivasan et al. |
| 7,111,630 B2 | 9/2006 | Mizobata et al. |
| 7,114,517 B2 | 10/2006 | Sund et al. |
| 7,211,144 B2 | 5/2007 | Lu et al. |
| 7,211,508 B2 | 5/2007 | Chung et al. |
| 7,211,525 B1 | 5/2007 | Shanker et al. |
| 7,241,686 B2 | 7/2007 | Marcadal et al. |
| 7,244,683 B2 | 7/2007 | Chung et al. |
| 7,262,133 B2 | 8/2007 | Chen et al. |
| 7,264,846 B2 | 9/2007 | Chang et al. |
| 7,265,048 B2 | 9/2007 | Chung et al. |
| 7,279,432 B2 | 10/2007 | Xi et al. |
| 7,282,458 B2 | 10/2007 | Gates et al. |
| 7,285,312 B2 | 10/2007 | Li |
| 7,317,229 B2 | 1/2008 | Hung et al. |
| 7,361,231 B2 | 4/2008 | Fury et al. |
| 7,371,467 B2 | 5/2008 | Han et al. |
| 7,396,565 B2 | 7/2008 | Yang et al. |
| 7,404,985 B2 | 7/2008 | Chang et al. |
| 7,405,158 B2 | 7/2008 | Lai et al. |
| 7,416,979 B2 | 8/2008 | Yoon et al. |
| 7,429,402 B2 | 9/2008 | Gandikota et al. |
| 7,429,540 B2 | 9/2008 | Olsen |
| 7,432,200 B2 | 10/2008 | Chowdhury et al. |
| 7,439,191 B2 | 10/2008 | Law et al. |
| 7,460,760 B2 | 12/2008 | Cho et al. |
| 7,465,650 B2 | 12/2008 | Derderian |
| 7,473,655 B2 | 1/2009 | Wang et al. |
| 7,491,658 B2 | 2/2009 | Nguyen et al. |
| 7,503,334 B1 | 3/2009 | Shrinivasan et al. |
| 7,507,660 B2 | 3/2009 | Chen et al. |
| 7,521,089 B2 | 4/2009 | Hillman et al. |
| 7,521,378 B2 | 4/2009 | Fucsko et al. |
| 7,531,468 B2 | 5/2009 | Metzner et al. |
| 7,541,297 B2 | 6/2009 | Mallick et al. |
| 7,547,952 B2 | 6/2009 | Metzner et al. |
| 7,569,501 B2 | 8/2009 | Metzner et al. |
| 7,573,586 B1 | 8/2009 | Boyer et al. |
| 7,576,441 B2 | 8/2009 | Yin et al. |
| 7,585,762 B2 | 9/2009 | Shah et al. |
| 7,595,263 B2 | 9/2009 | Chung et al. |
| 7,601,652 B2 | 10/2009 | Singh et al. |
| 7,629,227 B1 | 12/2009 | Wang et al. |
| 7,650,965 B2 | 1/2010 | Thayer et al. |
| 7,651,955 B2 | 1/2010 | Ranish et al. |
| 7,651,959 B2 | 1/2010 | Fukazawa et al. |
| 7,655,532 B1 | 2/2010 | Chen et al. |
| 7,691,442 B2 | 4/2010 | Gandikota et al. |
| 7,709,320 B2 | 5/2010 | Cheng |
| 7,732,327 B2 | 6/2010 | Lee et al. |
| 7,737,028 B2 | 6/2010 | Wang et al. |
| 7,759,749 B2 | 7/2010 | Tanikawa |
| 7,776,395 B2 | 8/2010 | Mahajani |
| 7,816,200 B2 | 10/2010 | Kher |
| 7,824,743 B2 | 11/2010 | Lee et al. |
| 7,825,038 B2 | 11/2010 | Ingle et al. |
| 7,825,042 B2 | 11/2010 | Mandal |
| 7,833,358 B2 | 11/2010 | Chu et al. |
| 7,846,840 B2 | 12/2010 | Kori et al. |
| 7,867,900 B2 | 1/2011 | Lee et al. |
| 7,867,914 B2 | 1/2011 | Xi et al. |
| 7,867,923 B2 | 1/2011 | Mallick et al. |
| 7,875,119 B2 | 1/2011 | Gartland et al. |
| 7,891,228 B2 | 2/2011 | Ding et al. |
| 7,910,165 B2 | 3/2011 | Ganguli et al. |
| 7,910,446 B2 | 3/2011 | Ma et al. |
| 7,964,505 B2 | 6/2011 | Khandelwal et al. |
| 7,964,506 B1 | 6/2011 | Ponnuswamy et al. |
| 7,972,978 B2 | 7/2011 | Mahajani |
| 8,027,089 B2 | 9/2011 | Hayashi |
| 8,043,907 B2 | 10/2011 | Ma et al. |
| 8,056,652 B2 | 11/2011 | Lockwood et al. |
| 8,227,078 B2 | 7/2012 | Morra et al. |
| 8,277,670 B2 | 10/2012 | Heo et al. |
| 8,278,224 B1 | 10/2012 | Mui et al. |
| 8,306,026 B2 | 11/2012 | Anjum et al. |
| 8,318,584 B2 | 11/2012 | Li et al. |
| 8,349,085 B2 | 1/2013 | Tahara et al. |
| 8,449,942 B2 | 5/2013 | Liang et al. |
| 8,455,368 B2 | 6/2013 | Chandler et al. |
| 8,466,073 B2 | 6/2013 | Wang et al. |
| 8,470,460 B2 | 6/2013 | Lee |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,585,873 B2 | 11/2013 | Ford et al. |
| 8,647,992 B2 | 2/2014 | Liang et al. |
| 8,648,253 B1 | 2/2014 | Woods et al. |
| 8,668,868 B2 | 3/2014 | Chiu et al. |
| 8,741,420 B2 | 6/2014 | Bunker et al. |
| 8,741,788 B2 | 6/2014 | Liang et al. |
| 8,871,297 B2 | 10/2014 | Barnett et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,190,321 B2 | 11/2015 | Cabral, Jr. et al. |
| 9,255,327 B2 | 2/2016 | Winter et al. |
| 9,257,314 B1 | 2/2016 | Rivera et al. |
| 9,306,026 B2 | 4/2016 | Toriumi et al. |
| 9,330,939 B2 | 5/2016 | Zope et al. |
| 9,362,107 B2 | 6/2016 | Thadani et al. |
| 9,382,621 B2 | 7/2016 | Choi et al. |
| 9,423,313 B2 | 8/2016 | Douba et al. |
| 9,484,406 B1 | 11/2016 | Sun et al. |
| 9,502,307 B1 | 11/2016 | Bao et al. |
| 9,570,551 B1 | 2/2017 | Balakrishnan et al. |
| 9,583,655 B2 | 2/2017 | Cheng |
| 9,646,850 B2 | 5/2017 | Pethe |
| 9,679,810 B1 | 6/2017 | Nag et al. |
| 9,683,281 B2 | 6/2017 | Meehan et al. |
| 9,685,371 B2 | 6/2017 | Zope et al. |
| 9,695,503 B2 | 7/2017 | Stowell et al. |
| 9,741,626 B1 | 8/2017 | Cheng et al. |
| 9,777,378 B2 | 10/2017 | Nemani et al. |
| 9,777,583 B2 | 10/2017 | Leggett |
| 9,873,940 B2 | 1/2018 | Xu et al. |
| 10,049,927 B2 | 8/2018 | Mebarki et al. |
| 10,083,834 B2 | 9/2018 | Thompson et al. |
| 10,096,516 B1 | 10/2018 | Leschkies et al. |
| 10,179,941 B1 | 1/2019 | Khan et al. |
| 10,224,224 B2 | 3/2019 | Liang et al. |
| 10,234,630 B2 | 3/2019 | Meyer Timmerman Thijssen et al. |
| 10,269,571 B2 | 4/2019 | Wong et al. |
| 10,276,411 B2 | 4/2019 | Delmas et al. |
| 10,287,899 B2 | 5/2019 | Dierberger |
| 10,369,593 B2 | 8/2019 | Barnett et al. |
| 10,403,729 B2 | 9/2019 | Lee |
| 10,410,918 B2 | 9/2019 | Wu et al. |
| 10,529,585 B2 | 1/2020 | Manna et al. |
| 10,529,603 B2 | 1/2020 | Liang et al. |
| 10,566,188 B2 | 2/2020 | Clemons et al. |

(56) References Cited

U.S. PATENT DOCUMENTS

| | | |
|---|---|---|
| 10,622,214 B2 | 4/2020 | Wong et al. |
| 10,633,740 B2 | 4/2020 | Melnik et al. |
| 10,636,669 B2 | 4/2020 | Chen et al. |
| 10,636,677 B2 | 4/2020 | Delmas et al. |
| 10,636,704 B2 | 4/2020 | Mebarki et al. |
| 10,643,867 B2 | 5/2020 | Delmas et al. |
| 10,675,581 B2 | 6/2020 | Khan et al. |
| 10,685,830 B2 | 6/2020 | Delmas |
| 10,714,331 B2 | 7/2020 | Balseanu et al. |
| 10,720,341 B2 | 7/2020 | Liang et al. |
| 10,748,783 B2 | 8/2020 | Khan et al. |
| 10,790,183 B2 | 9/2020 | Sun et al. |
| 10,847,360 B2 | 11/2020 | Wong et al. |
| 10,854,483 B2 | 12/2020 | Schaller et al. |
| 10,916,433 B2 | 2/2021 | Ren et al. |
| 10,950,429 B2 | 3/2021 | Citla et al. |
| 10,957,533 B2 | 3/2021 | Jiang et al. |
| 11,018,032 B2 | 5/2021 | Delmas et al. |
| 11,101,174 B2 | 8/2021 | Jiang et al. |
| 2001/0006853 A1 | 7/2001 | Tanabe et al. |
| 2001/0016429 A1 | 8/2001 | Mak et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2001/0055649 A1 | 12/2001 | Ogure et al. |
| 2002/0002258 A1 | 1/2002 | Hung et al. |
| 2002/0045782 A1 | 4/2002 | Hung et al. |
| 2002/0066535 A1 | 6/2002 | Brown et al. |
| 2002/0073922 A1 | 6/2002 | Frankel et al. |
| 2002/0098715 A1 | 7/2002 | Lane et al. |
| 2002/0117399 A1 | 8/2002 | Chen et al. |
| 2002/0122885 A1 | 9/2002 | Ahn |
| 2002/0127336 A1 | 9/2002 | Chen et al. |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2002/0155714 A1 | 10/2002 | Suzuki |
| 2002/0192056 A1 | 12/2002 | Reimer et al. |
| 2002/0197806 A1 | 12/2002 | Furukawa et al. |
| 2003/0010451 A1 | 1/2003 | Tzu et al. |
| 2003/0022487 A1 | 1/2003 | Yoon et al. |
| 2003/0030945 A1 | 2/2003 | Heinonen et al. |
| 2003/0049372 A1 | 3/2003 | Cook et al. |
| 2003/0053893 A1 | 3/2003 | Matsunaga et al. |
| 2003/0057526 A1 | 3/2003 | Chung et al. |
| 2003/0059535 A1 | 3/2003 | Luo et al. |
| 2003/0059538 A1 | 3/2003 | Chung et al. |
| 2003/0072884 A1 | 4/2003 | Zhang et al. |
| 2003/0082301 A1 | 5/2003 | Chen et al. |
| 2003/0101938 A1 | 6/2003 | Ronsse et al. |
| 2003/0121887 A1 | 7/2003 | Garvey et al. |
| 2003/0123216 A1 | 7/2003 | Yoon et al. |
| 2003/0124262 A1 | 7/2003 | Chen et al. |
| 2003/0129832 A1 | 7/2003 | Fujikawa |
| 2003/0132319 A1 | 7/2003 | Hytros et al. |
| 2003/0136520 A1 | 7/2003 | Yudovsky et al. |
| 2003/0139005 A1 | 7/2003 | Song et al. |
| 2003/0148035 A1 | 8/2003 | Lingampalli |
| 2003/0148631 A1 | 8/2003 | Kuo et al. |
| 2003/0157760 A1 | 8/2003 | Xi et al. |
| 2003/0172872 A1 | 9/2003 | Thakur et al. |
| 2003/0194615 A1 | 10/2003 | Krauth |
| 2003/0198754 A1 | 10/2003 | Xi et al. |
| 2003/0203616 A1 | 10/2003 | Chung et al. |
| 2003/0207593 A1 | 11/2003 | Derderian et al. |
| 2003/0215570 A1 | 11/2003 | Seutter et al. |
| 2003/0232512 A1 | 12/2003 | Dickinson et al. |
| 2003/0235961 A1 | 12/2003 | Metzner et al. |
| 2004/0009665 A1 | 1/2004 | Chen et al. |
| 2004/0013803 A1 | 1/2004 | Chung et al. |
| 2004/0018738 A1 | 1/2004 | Liu |
| 2004/0025908 A1 | 2/2004 | Douglas et al. |
| 2004/0060519 A1 | 4/2004 | Beauchaine et al. |
| 2004/0074869 A1 | 4/2004 | Wang et al. |
| 2004/0079648 A1 | 4/2004 | Khan et al. |
| 2004/0097060 A1 | 5/2004 | San et al. |
| 2004/0112409 A1 | 6/2004 | Schilling |
| 2004/0171280 A1 | 9/2004 | Conley et al. |
| 2004/0180510 A1 | 9/2004 | Ranade |
| 2004/0184792 A1 | 9/2004 | Hamelin et al. |
| 2004/0219800 A1 | 11/2004 | Tognetti |
| 2004/0248392 A1 | 12/2004 | Narwankar et al. |
| 2004/0255979 A1 | 12/2004 | Fury et al. |
| 2005/0003310 A1 | 1/2005 | Bai et al. |
| 2005/0003655 A1 | 1/2005 | Cathey et al. |
| 2005/0008780 A1 | 1/2005 | Ackerman et al. |
| 2005/0014365 A1 | 1/2005 | Moon et al. |
| 2005/0019593 A1 | 1/2005 | Mancini et al. |
| 2005/0022737 A1 | 2/2005 | Shimizu et al. |
| 2005/0051194 A1 | 3/2005 | Sakashita et al. |
| 2005/0053467 A1 | 3/2005 | Ackerman et al. |
| 2005/0074956 A1 | 4/2005 | Autryve et al. |
| 2005/0082281 A1 | 4/2005 | Uemori et al. |
| 2005/0085031 A1 | 4/2005 | Lopatin et al. |
| 2005/0109392 A1 | 5/2005 | Hollars |
| 2005/0136684 A1 | 6/2005 | Mukai et al. |
| 2005/0158590 A1 | 7/2005 | Li |
| 2005/0161158 A1 | 7/2005 | Schumacher |
| 2005/0164445 A1 | 7/2005 | Lin et al. |
| 2005/0186765 A1 | 8/2005 | Ma et al. |
| 2005/0191828 A1 | 9/2005 | Al-Bayati et al. |
| 2005/0198971 A1 | 9/2005 | Leitch et al. |
| 2005/0205210 A1 | 9/2005 | Devine et al. |
| 2005/0227479 A1 | 10/2005 | Feng et al. |
| 2005/0250347 A1 | 11/2005 | Bailey et al. |
| 2005/0255329 A1 | 11/2005 | Hazel |
| 2005/0260347 A1 | 11/2005 | Narwankar et al. |
| 2005/0260357 A1 | 11/2005 | Olsen et al. |
| 2005/0269291 A1 | 12/2005 | Kent |
| 2005/0271813 A1 | 12/2005 | Kher et al. |
| 2006/0003596 A1 | 1/2006 | Fucsko et al. |
| 2006/0019032 A1 | 1/2006 | Wang et al. |
| 2006/0019033 A1 | 1/2006 | Muthukrishnan et al. |
| 2006/0035035 A1 | 2/2006 | Sakama |
| 2006/0040052 A1 | 2/2006 | Fang et al. |
| 2006/0062917 A1 | 3/2006 | Muthukrishnan et al. |
| 2006/0079086 A1 | 4/2006 | Boit et al. |
| 2006/0084283 A1 | 4/2006 | Paranjpe et al. |
| 2006/0091493 A1 | 5/2006 | Wu |
| 2006/0105107 A1 | 5/2006 | Lindeboom et al. |
| 2006/0105515 A1 | 5/2006 | Amos et al. |
| 2006/0105557 A1 | 5/2006 | Klee et al. |
| 2006/0110934 A1 | 5/2006 | Fukuchi |
| 2006/0124613 A1 | 6/2006 | Kumar et al. |
| 2006/0128150 A1 | 6/2006 | Gandikota et al. |
| 2006/0148180 A1 | 7/2006 | Ahn et al. |
| 2006/0153995 A1 | 7/2006 | Narwankar et al. |
| 2006/0175012 A1 | 8/2006 | Lee |
| 2006/0207633 A1 | 9/2006 | Kim et al. |
| 2006/0226117 A1 | 10/2006 | Bertram et al. |
| 2006/0228895 A1 | 10/2006 | Chae et al. |
| 2006/0240187 A1 | 10/2006 | Weidman |
| 2006/0246213 A1 | 11/2006 | Moreau et al. |
| 2006/0279025 A1 | 12/2006 | Heidari et al. |
| 2006/0286819 A1 | 12/2006 | Seutter et al. |
| 2006/0290017 A1 | 12/2006 | Yanagisawa |
| 2007/0009658 A1 | 1/2007 | Yoo et al. |
| 2007/0009660 A1 | 1/2007 | Sasaki et al. |
| 2007/0012402 A1 | 1/2007 | Sneh |
| 2007/0045753 A1 | 3/2007 | Pae et al. |
| 2007/0049043 A1 | 3/2007 | Muthukrishnan et al. |
| 2007/0054487 A1 | 3/2007 | Ma et al. |
| 2007/0065578 A1 | 3/2007 | McDougall |
| 2007/0087533 A1 | 4/2007 | Nishikawa et al. |
| 2007/0095651 A1 | 5/2007 | Ye et al. |
| 2007/0099415 A1 | 5/2007 | Chen et al. |
| 2007/0111519 A1 | 5/2007 | Lubomirsky et al. |
| 2007/0116873 A1 | 5/2007 | Li et al. |
| 2007/0134518 A1 | 6/2007 | Feist et al. |
| 2007/0145416 A1 | 6/2007 | Ohta |
| 2007/0187386 A1 | 8/2007 | Kim et al. |
| 2007/0202254 A1 | 8/2007 | Ganguli et al. |
| 2007/0204797 A1 | 9/2007 | Fischer |
| 2007/0209931 A1 | 9/2007 | Miller |

(56) References Cited

U.S. PATENT DOCUMENTS

| | | |
|---|---|---|
| 2007/0212850 A1 | 9/2007 | Ingle et al. |
| 2007/0243317 A1 | 10/2007 | Du Bois et al. |
| 2007/0254471 A1 | 11/2007 | Kameyama et al. |
| 2007/0254477 A1 | 11/2007 | Muraoka et al. |
| 2007/0256559 A1 | 11/2007 | Chen et al. |
| 2007/0259111 A1 | 11/2007 | Singh et al. |
| 2007/0274837 A1 | 11/2007 | Taylor et al. |
| 2008/0001196 A1 | 1/2008 | Cheng |
| 2008/0032510 A1 | 2/2008 | Olsen |
| 2008/0038578 A1 | 2/2008 | Li |
| 2008/0056905 A1 | 3/2008 | Golecki |
| 2008/0073691 A1 | 3/2008 | Konno et al. |
| 2008/0074658 A1 | 3/2008 | Davis et al. |
| 2008/0076230 A1 | 3/2008 | Cheng |
| 2008/0083109 A1 | 4/2008 | Shibata et al. |
| 2008/0085611 A1 | 4/2008 | Khandelwal et al. |
| 2008/0090425 A9 | 4/2008 | Olsen |
| 2008/0113095 A1 | 5/2008 | Gorman et al. |
| 2008/0115726 A1 | 5/2008 | Ingle et al. |
| 2008/0121882 A1 | 5/2008 | Hwang et al. |
| 2008/0132050 A1 | 6/2008 | Lavoie |
| 2008/0135914 A1 | 6/2008 | Krishna et al. |
| 2008/0210273 A1 | 9/2008 | Joe |
| 2008/0241384 A1 | 10/2008 | Jeong et al. |
| 2008/0246099 A1 | 10/2008 | Varghese et al. |
| 2008/0251904 A1 | 10/2008 | Theuss et al. |
| 2008/0268154 A1 | 10/2008 | Kher et al. |
| 2008/0268635 A1 | 10/2008 | Yu et al. |
| 2008/0311711 A1 | 12/2008 | Hampp et al. |
| 2008/0315762 A1 | 12/2008 | Hamada et al. |
| 2009/0004386 A1 | 1/2009 | Makela et al. |
| 2009/0004850 A1 | 1/2009 | Ganguli et al. |
| 2009/0018688 A1 | 1/2009 | Chandler et al. |
| 2009/0029126 A1 | 1/2009 | Tanikawa |
| 2009/0035915 A1 | 2/2009 | Su |
| 2009/0035952 A1 | 2/2009 | Chua et al. |
| 2009/0053426 A1 | 2/2009 | Lu et al. |
| 2009/0053893 A1 | 2/2009 | Khandelwal et al. |
| 2009/0061613 A1 | 3/2009 | Choi et al. |
| 2009/0081884 A1 | 3/2009 | Yokota et al. |
| 2009/0087981 A1 | 4/2009 | Suzuki et al. |
| 2009/0098289 A1 | 4/2009 | Deininger et al. |
| 2009/0098346 A1 | 4/2009 | Li |
| 2009/0110622 A1 | 4/2009 | Chiu et al. |
| 2009/0148965 A1 | 6/2009 | Kim et al. |
| 2009/0155976 A1 | 6/2009 | Ahn et al. |
| 2009/0180847 A1 | 7/2009 | Guo et al. |
| 2009/0183992 A1 | 7/2009 | Fredenberg et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2009/0246952 A1 | 10/2009 | Ishizaka et al. |
| 2009/0269507 A1 | 10/2009 | Yu et al. |
| 2009/0283735 A1 | 11/2009 | Li et al. |
| 2009/0286400 A1 | 11/2009 | Heo et al. |
| 2009/0298257 A1 | 12/2009 | Lee et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0032838 A1 | 2/2010 | Kikuchi et al. |
| 2010/0062149 A1 | 3/2010 | Ma et al. |
| 2010/0062614 A1 | 3/2010 | Ma et al. |
| 2010/0072569 A1 | 3/2010 | Han et al. |
| 2010/0075499 A1 | 3/2010 | Olsen |
| 2010/0102417 A1 | 4/2010 | Ganguli et al. |
| 2010/0110451 A1 | 5/2010 | Biswas et al. |
| 2010/0120245 A1 | 5/2010 | Tjandra et al. |
| 2010/0159150 A1 | 6/2010 | Kirby et al. |
| 2010/0167527 A1 | 7/2010 | Wu et al. |
| 2010/0173470 A1 | 7/2010 | Lee et al. |
| 2010/0173495 A1 | 7/2010 | Thakur et al. |
| 2010/0196626 A1 | 8/2010 | Choi et al. |
| 2010/0203725 A1 | 8/2010 | Choi et al. |
| 2010/0239758 A1 | 9/2010 | Kher et al. |
| 2010/0248419 A1 | 9/2010 | Woodruff et al. |
| 2010/0270609 A1 | 10/2010 | Olsen et al. |
| 2010/0273324 A1 | 10/2010 | Lin et al. |
| 2010/0297854 A1 | 11/2010 | Ramamurthy et al. |
| 2010/0304027 A1 | 12/2010 | Lee et al. |
| 2010/0320459 A1 | 12/2010 | Umeda et al. |
| 2010/0323517 A1 | 12/2010 | Baker-O'Neal et al. |
| 2010/0327422 A1 | 12/2010 | Lee et al. |
| 2011/0011737 A1 | 1/2011 | Wu et al. |
| 2011/0048524 A1 | 3/2011 | Nam et al. |
| 2011/0124192 A1 | 5/2011 | Ganguli et al. |
| 2011/0151677 A1 | 6/2011 | Wang et al. |
| 2011/0163449 A1 | 7/2011 | Kelly et al. |
| 2011/0165781 A1 | 7/2011 | Liang et al. |
| 2011/0174363 A1 | 7/2011 | Munteanu |
| 2011/0175038 A1 | 7/2011 | Hou et al. |
| 2011/0198736 A1 | 8/2011 | Shero et al. |
| 2011/0204518 A1 | 8/2011 | Arunachalam |
| 2011/0233110 A1 | 9/2011 | Koseoglu et al. |
| 2011/0233778 A1 | 9/2011 | Lee et al. |
| 2011/0237019 A1 | 9/2011 | Horng et al. |
| 2011/0240464 A1 | 10/2011 | Rasheed et al. |
| 2011/0263091 A1 | 10/2011 | Yamazaki |
| 2011/0293825 A1 | 12/2011 | Atwal et al. |
| 2011/0303147 A1 | 12/2011 | Tachibana et al. |
| 2011/0305836 A1 | 12/2011 | Murata et al. |
| 2012/0024403 A1 | 2/2012 | Gage et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0082783 A1 | 4/2012 | Barnett et al. |
| 2012/0100678 A1 | 4/2012 | Sako et al. |
| 2012/0112224 A1 | 5/2012 | Le Bellac et al. |
| 2012/0138146 A1 | 6/2012 | Furuhata et al. |
| 2012/0142192 A1 | 6/2012 | Li et al. |
| 2012/0142198 A1 | 6/2012 | Wang et al. |
| 2012/0148944 A1 | 6/2012 | Oh et al. |
| 2012/0153483 A1 | 6/2012 | Akolkar et al. |
| 2012/0175822 A1 | 7/2012 | Inamiya et al. |
| 2012/0252207 A1 | 10/2012 | Lei et al. |
| 2012/0252210 A1* | 10/2012 | Tohnoe ............ H01L 21/28556 438/658 |
| 2012/0258602 A1 | 10/2012 | Subramani et al. |
| 2012/0276306 A1 | 11/2012 | Ueda |
| 2012/0285492 A1 | 11/2012 | Lee et al. |
| 2012/0304485 A1 | 12/2012 | Hayashi et al. |
| 2012/0309190 A1 | 12/2012 | Kelly et al. |
| 2012/0318773 A1 | 12/2012 | Wu et al. |
| 2013/0048605 A1 | 2/2013 | Sapre et al. |
| 2013/0068391 A1 | 3/2013 | Mazzocco et al. |
| 2013/0069174 A1 | 3/2013 | Chuang et al. |
| 2013/0145761 A1 | 6/2013 | McAlister |
| 2013/0164456 A1 | 6/2013 | Winter et al. |
| 2013/0194350 A1 | 8/2013 | Watanabe et al. |
| 2013/0233170 A1 | 9/2013 | Spiegelman et al. |
| 2013/0241037 A1 | 9/2013 | Jeong et al. |
| 2013/0256125 A1 | 10/2013 | Young et al. |
| 2013/0277760 A1 | 10/2013 | Lu et al. |
| 2013/0288485 A1 | 10/2013 | Liang et al. |
| 2013/0292655 A1 | 11/2013 | Becker et al. |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0003892 A1 | 1/2014 | Yamamoto et al. |
| 2014/0023320 A1 | 1/2014 | Lee et al. |
| 2014/0034632 A1 | 2/2014 | Pan et al. |
| 2014/0045300 A1 | 2/2014 | Chen et al. |
| 2014/0051264 A1 | 2/2014 | Mallick et al. |
| 2014/0076494 A1 | 3/2014 | Miyashita et al. |
| 2014/0102877 A1 | 4/2014 | Yamazaki |
| 2014/0103284 A1 | 4/2014 | Hsueh et al. |
| 2014/0134827 A1 | 5/2014 | Swaminathan et al. |
| 2014/0138802 A1 | 5/2014 | Starostine et al. |
| 2014/0144462 A1 | 5/2014 | Verhaverbeke et al. |
| 2014/0159135 A1 | 6/2014 | Fujimoto et al. |
| 2014/0183743 A1 | 7/2014 | Matsumoto et al. |
| 2014/0213070 A1 | 7/2014 | Hong et al. |
| 2014/0231384 A1 | 8/2014 | Underwood et al. |
| 2014/0234583 A1 | 8/2014 | Ryu et al. |
| 2014/0235068 A1 | 8/2014 | Ashihara et al. |

(56) References Cited

U.S. PATENT DOCUMENTS

| | | |
|---|---|---|
| 2014/0239291 A1 | 8/2014 | Son et al. |
| 2014/0239292 A1 | 8/2014 | Kim et al. |
| 2014/0264237 A1 | 9/2014 | Chen et al. |
| 2014/0264297 A1 | 9/2014 | Kumar et al. |
| 2014/0268080 A1 | 9/2014 | Beasley et al. |
| 2014/0271220 A1 | 9/2014 | Leggett |
| 2014/0273335 A1 | 9/2014 | Abushama |
| 2014/0284821 A1 | 9/2014 | Hubbard |
| 2014/0319129 A1 | 10/2014 | Ahmad |
| 2014/0319462 A1 | 10/2014 | Huang et al. |
| 2014/0322921 A1 | 10/2014 | Ahmad et al. |
| 2015/0000870 A1 | 1/2015 | Hosotani et al. |
| 2015/0017324 A1 | 1/2015 | Barnett et al. |
| 2015/0021672 A1 | 1/2015 | Chuang et al. |
| 2015/0024592 A1 | 1/2015 | Chandrashekar et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0093891 A1 | 4/2015 | Zope et al. |
| 2015/0099342 A1 | 4/2015 | Tsai et al. |
| 2015/0102340 A1 | 4/2015 | Shimoda et al. |
| 2015/0140835 A1 | 5/2015 | Tateno et al. |
| 2015/0144999 A1 | 5/2015 | Ching et al. |
| 2015/0145002 A1 | 5/2015 | Lee et al. |
| 2015/0159272 A1 | 6/2015 | Yoon et al. |
| 2015/0179501 A1 | 6/2015 | Jhaveri et al. |
| 2015/0184296 A1 | 7/2015 | Xu et al. |
| 2015/0197455 A1 | 7/2015 | Pranov |
| 2015/0203961 A1 | 7/2015 | Ha et al. |
| 2015/0221541 A1 | 8/2015 | Nemani et al. |
| 2015/0246329 A1 | 9/2015 | Itonaga et al. |
| 2015/0255581 A1 | 9/2015 | Lin et al. |
| 2015/0279635 A1 | 10/2015 | Subramani et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0348824 A1 | 12/2015 | Kuenle et al. |
| 2015/0357195 A1 | 12/2015 | Lam et al. |
| 2015/0364348 A1 | 12/2015 | Park et al. |
| 2015/0364554 A1 | 12/2015 | Kim et al. |
| 2016/0010472 A1 | 1/2016 | Murphy et al. |
| 2016/0027661 A1 | 1/2016 | Sato et al. |
| 2016/0027887 A1 | 1/2016 | Yuan et al. |
| 2016/0035600 A1 | 2/2016 | Rivera et al. |
| 2016/0053366 A1 | 2/2016 | Stowell et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |
| 2016/0093726 A1 | 3/2016 | Ching et al. |
| 2016/0111272 A1 | 4/2016 | Girard et al. |
| 2016/0111337 A1 | 4/2016 | Hatcher et al. |
| 2016/0118260 A1 | 4/2016 | Mebarki et al. |
| 2016/0118391 A1 | 4/2016 | Zhao et al. |
| 2016/0126104 A1 | 5/2016 | Shaviv et al. |
| 2016/0163540 A1 | 6/2016 | Liao et al. |
| 2016/0181414 A1 | 6/2016 | Huang et al. |
| 2016/0186363 A1 | 6/2016 | Merzaghi et al. |
| 2016/0204027 A1 | 7/2016 | Lakshmanan et al. |
| 2016/0208414 A1 | 7/2016 | Odawara et al. |
| 2016/0251972 A1 | 9/2016 | Dierberger |
| 2016/0260526 A1 | 9/2016 | Otto |
| 2016/0268127 A1 | 9/2016 | Yamazaki |
| 2016/0273758 A1 | 9/2016 | Fujimura |
| 2016/0274454 A1 | 9/2016 | Beasley et al. |
| 2016/0281230 A1 | 9/2016 | Varadarajan et al. |
| 2016/0284882 A1 | 9/2016 | Jang |
| 2016/0298222 A1 | 10/2016 | Meehan et al. |
| 2016/0300709 A1 | 10/2016 | Posseme et al. |
| 2016/0308048 A1 | 10/2016 | Ching et al. |
| 2016/0314964 A1 | 10/2016 | Tang et al. |
| 2016/0328635 A1 | 11/2016 | Dave et al. |
| 2016/0329190 A1 | 11/2016 | Evans et al. |
| 2016/0329458 A1 | 11/2016 | Evans et al. |
| 2016/0334162 A1 | 11/2016 | Kim et al. |
| 2016/0336405 A1 | 11/2016 | Sun et al. |
| 2016/0336475 A1 | 11/2016 | Mackie et al. |
| 2016/0353522 A1 | 12/2016 | Rathi et al. |
| 2016/0355927 A1 | 12/2016 | Weaver et al. |
| 2016/0358809 A1 | 12/2016 | Brown et al. |
| 2016/0358815 A1 | 12/2016 | Yu et al. |
| 2016/0372319 A1 | 12/2016 | Zeng et al. |
| 2016/0377972 A1 | 12/2016 | Hofmann et al. |
| 2016/0379853 A1 | 12/2016 | Schaller et al. |
| 2016/0379854 A1 | 12/2016 | Vopat et al. |
| 2017/0005188 A1 | 1/2017 | Cheng et al. |
| 2017/0005204 A1 | 1/2017 | Hosoba et al. |
| 2017/0008040 A1 | 1/2017 | Jeong et al. |
| 2017/0011932 A1 | 1/2017 | Pethe et al. |
| 2017/0053784 A1 | 2/2017 | Subramani et al. |
| 2017/0053946 A1 | 2/2017 | Matsuzaki et al. |
| 2017/0076968 A1 | 3/2017 | Wang et al. |
| 2017/0084425 A1 | 3/2017 | Uziel et al. |
| 2017/0084487 A1 | 3/2017 | Chebiam et al. |
| 2017/0104062 A1 | 4/2017 | Bi et al. |
| 2017/0110616 A1 | 4/2017 | Dissanayake et al. |
| 2017/0117379 A1 | 4/2017 | Chen et al. |
| 2017/0140996 A1 | 5/2017 | Lin et al. |
| 2017/0160012 A1 | 6/2017 | Kobayashi et al. |
| 2017/0162413 A1 | 6/2017 | Rebstock |
| 2017/0194430 A1 | 7/2017 | Wood et al. |
| 2017/0200642 A1 | 7/2017 | Shaviv |
| 2017/0213570 A1 | 7/2017 | Cheng et al. |
| 2017/0225119 A1 | 8/2017 | Mahecha-Botero et al. |
| 2017/0233930 A1 | 8/2017 | Keuleers et al. |
| 2017/0253968 A1 | 9/2017 | Yahata |
| 2017/0263702 A1 | 9/2017 | Chan et al. |
| 2017/0263773 A1 | 9/2017 | Yamazaki |
| 2017/0287842 A1 | 10/2017 | Fu et al. |
| 2017/0292445 A1 | 10/2017 | Nelson et al. |
| 2017/0301767 A1 | 10/2017 | Niimi et al. |
| 2017/0314125 A1 | 11/2017 | Fenwick et al. |
| 2017/0317109 A1 | 11/2017 | Wang et al. |
| 2017/0358483 A1 | 12/2017 | Roy et al. |
| 2018/0003567 A1 | 1/2018 | Petry et al. |
| 2018/0006215 A1 | 1/2018 | Jeong et al. |
| 2018/0019249 A1 | 1/2018 | Zhang et al. |
| 2018/0023192 A1 | 1/2018 | Chandra et al. |
| 2018/0033615 A1 | 2/2018 | Tjandra |
| 2018/0051368 A1 | 2/2018 | Liu et al. |
| 2018/0053725 A1 | 2/2018 | Edelstein et al. |
| 2018/0068890 A1 | 3/2018 | Zope et al. |
| 2018/0087418 A1 | 3/2018 | Cadigan et al. |
| 2018/0096847 A1 | 4/2018 | Thompson et al. |
| 2018/0096874 A1 | 4/2018 | Schaller et al. |
| 2018/0105932 A1 | 4/2018 | Fenwick et al. |
| 2018/0127868 A1 | 5/2018 | Xu et al. |
| 2018/0182856 A1 | 6/2018 | Lee |
| 2018/0204720 A1 | 7/2018 | Tanaka et al. |
| 2018/0204742 A1 | 7/2018 | Tateno et al. |
| 2018/0209037 A1 | 7/2018 | Citla et al. |
| 2018/0240682 A1 | 8/2018 | Lai et al. |
| 2018/0258533 A1 | 9/2018 | Liang et al. |
| 2018/0261480 A1 | 9/2018 | Liang et al. |
| 2018/0261516 A1 | 9/2018 | Lin et al. |
| 2018/0261686 A1 | 9/2018 | Lin et al. |
| 2018/0264516 A1 | 9/2018 | Fujikawa et al. |
| 2018/0286674 A1 | 10/2018 | Manna et al. |
| 2018/0308669 A1 | 10/2018 | Bokka et al. |
| 2018/0315626 A1 | 11/2018 | Franklin |
| 2018/0323093 A1 | 11/2018 | Zhang et al. |
| 2018/0329189 A1 | 11/2018 | Banna et al. |
| 2018/0337027 A1 | 11/2018 | L'Heureux et al. |
| 2018/0339314 A1 | 11/2018 | Bhoyar et al. |
| 2018/0342384 A1 | 11/2018 | Wong et al. |
| 2018/0342396 A1 | 11/2018 | Wong et al. |
| 2018/0350563 A1 | 12/2018 | Manna et al. |
| 2018/0351164 A1 | 12/2018 | Hellmich et al. |
| 2018/0358229 A1 | 12/2018 | Koshizawa et al. |
| 2018/0366328 A1 | 12/2018 | Ren et al. |
| 2019/0019690 A1 | 1/2019 | Choi et al. |
| 2019/0019708 A1 | 1/2019 | Weaver et al. |
| 2019/0032194 A2 | 1/2019 | Dieguez-Campo et al. |
| 2019/0057879 A1 | 2/2019 | Delmas et al. |

(56) References Cited

U.S. PATENT DOCUMENTS

| | | |
|---|---|---|
| 2019/0079388 A1 | 3/2019 | Fender et al. |
| 2019/0088543 A1 | 3/2019 | Lin et al. |
| 2019/0119769 A1 | 4/2019 | Khan et al. |
| 2019/0130731 A1 | 5/2019 | Hassan et al. |
| 2019/0139793 A1 | 5/2019 | Delmas et al. |
| 2019/0148178 A1 | 5/2019 | Liang et al. |
| 2019/0148186 A1 | 5/2019 | Schaller et al. |
| 2019/0157074 A1 | 5/2019 | Delmas |
| 2019/0170591 A1 | 6/2019 | Petry et al. |
| 2019/0198367 A1 | 6/2019 | Liang et al. |
| 2019/0198368 A1 | 6/2019 | Weaver et al. |
| 2019/0228982 A1 | 7/2019 | Chen et al. |
| 2019/0229004 A1 | 7/2019 | Schaller et al. |
| 2019/0237345 A1 | 8/2019 | Delmas et al. |
| 2019/0258153 A1 | 8/2019 | Nemani et al. |
| 2019/0259625 A1 | 8/2019 | Nemani et al. |
| 2019/0259638 A1 | 8/2019 | Schaller et al. |
| 2019/0271076 A1 | 9/2019 | Fenwick et al. |
| 2019/0279879 A1 | 9/2019 | Singh et al. |
| 2019/0284686 A1 | 9/2019 | Melnik et al. |
| 2019/0284692 A1 | 9/2019 | Melnik et al. |
| 2019/0284694 A1 | 9/2019 | Knisley et al. |
| 2019/0287808 A1 | 9/2019 | Goradia et al. |
| 2019/0311896 A1 | 10/2019 | Balseanu et al. |
| 2019/0311900 A1 | 10/2019 | Pandit et al. |
| 2019/0311909 A1 | 10/2019 | Bajaj et al. |
| 2019/0326138 A1 | 10/2019 | Forderhase et al. |
| 2019/0330746 A1 | 10/2019 | Britz et al. |
| 2019/0360100 A1 | 11/2019 | Nguyen et al. |
| 2019/0360633 A1 | 11/2019 | Schaller et al. |
| 2019/0368035 A1 | 12/2019 | Malik et al. |
| 2019/0371650 A1 | 12/2019 | Sun et al. |
| 2019/0375105 A1 | 12/2019 | Weaver et al. |
| 2019/0382879 A1 | 12/2019 | Jindal et al. |
| 2020/0027767 A1 | 1/2020 | Zang et al. |
| 2020/0035509 A1 | 1/2020 | Khan et al. |
| 2020/0035513 A1 | 1/2020 | Khan et al. |
| 2020/0043722 A1 | 2/2020 | Cheng et al. |
| 2020/0075392 A1 | 3/2020 | Brown et al. |
| 2020/0098574 A1 | 3/2020 | Wong et al. |
| 2020/0240018 A1 | 7/2020 | Melnik et al. |
| 2020/0361124 A1 | 11/2020 | Britz |
| 2020/0392626 A1 | 12/2020 | Chatterjee et al. |
| 2021/0167235 A1 | 6/2021 | Li et al. |
| 2021/0335626 A1 | 10/2021 | Xue et al. |
| 2022/0102175 A1 | 3/2022 | Chen et al. |

FOREIGN PATENT DOCUMENTS

| | | |
|---|---|---|
| CN | 102386052 A | 3/2012 |
| CN | 102856234 A | 1/2013 |
| CN | 104047676 A | 9/2014 |
| CN | 104089491 A | 10/2014 |
| CN | 105408985 A | 3/2016 |
| CN | 103035513 B | 10/2016 |
| EP | 0516344 A1 | 12/1992 |
| EP | 0670590 A2 | 9/1995 |
| EP | 1069213 A2 | 1/2001 |
| EP | 1107288 A2 | 6/2001 |
| EP | 0840365 A3 | 10/2003 |
| JP | S63-004616 A | 1/1988 |
| JP | S6367721 A | 3/1988 |
| JP | H1218018 A | 8/1989 |
| JP | H04355922 A | 12/1992 |
| JP | H0521347 A | 1/1993 |
| JP | H06283496 A | 10/1994 |
| JP | H07048489 B2 | 5/1995 |
| JP | H07158767 A | 6/1995 |
| JP | H08195493 A | 7/1996 |
| JP | H09048690 A | 2/1997 |
| JP | H9296267 A | 11/1997 |
| JP | H10214880 A | 8/1998 |
| JP | H10335657 A | 12/1998 |
| JP | H11209872 A | 8/1999 |
| JP | H11354515 A | 12/1999 |
| JP | 2000221799 A | 8/2000 |
| JP | 2000357699 A | 12/2000 |
| JP | 2001053066 A | 2/2001 |
| JP | 2001110729 A | 4/2001 |
| JP | 2001274161 A | 10/2001 |
| JP | 200351474 A | 2/2003 |
| JP | 2003166065 A | 6/2003 |
| JP | 2003188387 A | 7/2003 |
| JP | 2003243374 A | 8/2003 |
| JP | 2004127958 A | 4/2004 |
| JP | 200579528 A | 3/2005 |
| JP | 2005064269 A | 3/2005 |
| JP | 2005530343 A | 10/2005 |
| JP | 2005333015 A | 12/2005 |
| JP | 2006526125 A | 11/2006 |
| JP | 2007524229 A | 8/2007 |
| JP | 2007242791 A | 9/2007 |
| JP | 2008073611 A | 4/2008 |
| JP | 2008118118 A | 5/2008 |
| JP | 2008153635 A | 7/2008 |
| JP | 2009117404 A | 5/2009 |
| JP | 2009129927 A | 6/2009 |
| JP | 2009539231 A | 11/2009 |
| JP | 201080949 A | 4/2010 |
| JP | 2010168607 A | 8/2010 |
| JP | 2010205854 A | 9/2010 |
| JP | 201129394 A | 2/2011 |
| JP | 2011108739 A | 6/2011 |
| JP | 2011258943 A | 12/2011 |
| JP | 2012503883 A | 2/2012 |
| JP | 2012204656 A | 10/2012 |
| JP | 2013105777 A | 5/2013 |
| JP | 2013516788 A | 5/2013 |
| JP | 2013175710 A | 9/2013 |
| JP | 2013179244 A | 9/2013 |
| JP | 2014019912 A | 2/2014 |
| JP | 2014103351 A | 6/2014 |
| JP | 2014525143 A | 9/2014 |
| JP | 2015067884 A | 4/2015 |
| JP | 2015086459 A | 5/2015 |
| JP | 2015115394 A | 6/2015 |
| JP | 2015233157 A | 12/2015 |
| KR | 19980063671 A | 10/1998 |
| KR | 2001-0051185 A | 6/2001 |
| KR | 20010046452 A | 6/2001 |
| KR | 20010046843 A | 6/2001 |
| KR | 20030052162 A | 6/2003 |
| KR | 100422433 B1 | 7/2004 |
| KR | 10-20040068969 A | 8/2004 |
| KR | 20050121750 A | 12/2005 |
| KR | 20070006602 A | 1/2007 |
| KR | 100684910 B1 | 2/2007 |
| KR | 20070048821 A | 5/2007 |
| KR | 20070068596 A | 7/2007 |
| KR | 20070075383 A | 7/2007 |
| KR | 20090011463 A | 2/2009 |
| KR | 1020090040867 A | 4/2009 |
| KR | 10-2009-0064279 A | 6/2009 |
| KR | 10-2010-0035000 A | 4/2010 |
| KR | 20110136532 A | 12/2011 |
| KR | 101287035 B1 | 7/2013 |
| KR | 101305904 B1 | 9/2013 |
| KR | 20140003776 A | 1/2014 |
| KR | 20140104112 A | 8/2014 |
| KR | 101438291 B1 | 9/2014 |
| KR | 20140135744 A | 11/2014 |
| KR | 20150006587 A | 1/2015 |
| KR | 20150062545 A | 6/2015 |
| KR | 10-2015-0130370 A | 11/2015 |
| KR | 20150122432 A | 11/2015 |
| KR | 20160044004 A | 4/2016 |
| KR | 20160061437 A | 5/2016 |
| TW | 200529284 | 9/2005 |
| TW | 200721316 A | 6/2007 |
| TW | 201246274 A | 11/2012 |
| TW | 201507174 A | 2/2015 |
| TW | 201608672 A | 3/2016 |
| TW | 201708597 A | 3/2017 |
| WO | 200051938 A1 | 9/2000 |

(56) References Cited

FOREIGN PATENT DOCUMENTS

| WO | 03023827 A1 | 3/2003 |
|---|---|---|
| WO | 2004102055 A1 | 11/2004 |
| WO | 2005057663 A2 | 6/2005 |
| WO | 2008047886 A1 | 4/2008 |
| WO | 2008089178 A2 | 7/2008 |
| WO | 2010115128 A3 | 1/2011 |
| WO | 2011002058 A1 | 1/2011 |
| WO | 2011103062 A2 | 8/2011 |
| WO | 2012133583 A1 | 10/2012 |
| WO | 2014115600 A1 | 7/2014 |
| WO | 2015195081 A1 | 12/2015 |
| WO | 2016018593 A1 | 2/2016 |
| WO | 2016065219 A1 | 4/2016 |
| WO | 2016111833 A1 | 7/2016 |
| WO | 2018187546 A1 | 10/2018 |

OTHER PUBLICATIONS

Taiwan Office Action dated Feb. 21, 2020 for Application No. 108138212.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
International Search Report and Written Opinion for PCT/US2019/023431 dated Jul. 5, 2019.
International Search Report and Written Opinion from PCT/US2019/012161 dated Apr. 30, 2019.
Office Action for Japanese Patent Application No. 2020-500629 dated Jun. 8, 2021.
Office Action for Japanese Application No. 2019-548976 dated Oct. 20, 2020.
Japanese Office Action dated Apr. 20, 2021 for Application No. JP 2020-508603.
International Search Report and Written Opinion dated Nov. 30, 2018 for Application No. PCT/US2018/041688.
Extended European Search Report for EP Application No. 18876650.5 dated Jul. 19, 2021.
Pedestal definition from Dictionary.com, printed on Feb. 10, 2020 (year 2020).
International Search Report and Written Opinion for PCT/US2018/038822 dated Oct. 26, 2018.
International Search Report and Written Opinion dated Jan. 31, 2019 for Application No. PCT/US2018/042760.
Extended European Search Report for EP Application No. 18806169.1 dated Jul. 19, 2021.
Office Action for Korean Application No. 10-2019-7029776 dated Jan. 18, 2021.
Taiwan Office Action dated Nov. 19, 2019 for Application No. 108103415.
Japanese Office Action dated Feb. 16, 2021 for Application No. 2019-564964.
Korean Office Action dated Jul. 16, 2021 for Application No. 10-2020-7007956.
International Search Report and Written Opinion for PCT/US2018/059676 dated May 23, 2019.
Taiwan Office Action dated Jul. 3, 2019 for Application No. 107136151.
International Search Report and Written Opinion from PCT/US2018/034036 dated Aug. 24, 2018.
Office Action from Taiwan Patent Application No. 108104585 dated Jan. 30, 2020, with concise statement of relevance.
International Search Report, Application No. PCT/US2018/028258 dated Aug. 9, 2018.
Korean Office Action issued to Application No. 10-2019-7038099 dated May 1, 2021.
International Search Report and Written Opinion for PCT/US2018/037539 dated Oct. 5, 2018.
European International Search Report issued to 18764622.9 dated Nov. 20, 2020.
International Search Report and Written Opinion for International Application No. PCT/US2019/040195 dated Oct. 25, 2019.
Lee, Ho-Saeng et al., "The cooling heat transfer characteristics of the supercritical $CO_2$ in mico-fin tube", Springer, Oct. 2, 2012, pp. 173-184.
Shimoyama, Takehiro et al., "Porous Aluminum for Heat Exchanger", Hitachi Chemical, pp. 19-20.
Office Action for Taiwan Patent Application No. 108111501 dated Nov. 14, 2019.
International Search Report and Written Opinion for PCT/US2018/035210 dated Aug. 24, 2018.
International Search Report and Written Opinion for PCT/US2019/056447 dated Feb. 7, 2020.
KR Office Action dated Feb. 4, 2020 for Application No. 10-2018-0133399.
International Search Report and Written Opinion for PCT/US2019/015339 dated May 15, 2019.
International Search Report and Written Opinion for PCT/US2019/015332 dated May 15, 2019.
Taiwan Office Action dated Jun. 11, 2019 for Application No. 107138905.
International Search Report and Written Opinion dated Aug. 24, 2018 for Application No. PCT/US2018/034284.
Taiwan Office Action dated Oct. 12, 2020 for Application No. 108140559.
Kato, T. et al., "Heat Transfer Characteristics of a Plate-Fin Type Supercritical/Liquid Helium Heat Exchanger", ICEC 14 Proceedings Supplement, 1992, pp. 260-263.
Office Action for Japanese Patent Application No. 2019-548976 dated May 25, 2021.
International Search Report and Written Opinion for PCT/US2018/050464 dated Jan. 4, 2019.
Office Action for Japanese Application No. 2018-546484 dated Oct. 8, 2019.
Office Action for Korean Application No. 10-2020-7004396 dated Apr. 5, 2021.
International Search Report and Written Opinion for PCT/US2018/021715 dated Jun. 22, 2018.
Office Action for Japanese Application No. 2018-517285 dated Oct. 23, 2019.
International Search Report and Written Opinion for International Application No. PCT/US2019/059659 dated Feb. 26, 2020.
International Search Report and Written Opinion for International Application No. PCT/US2019/029602 dated Aug. 14, 2019.
Haskel Pressure on Demand, Pneumatic and Hydraulic Driven Gas Boosters, Apr. 30, 2016, 36 pp.
Taiwan Office Action dated May 4, 2020 for Application No. 107121254.
Extended European International Search Report issued to 18831823.2 dated Mar. 19, 2021.
EPO Extended European Search Report dated Aug. 9, 2019, for European Patent Application No. 19166775.7.
Ahn, Byung Du, et. al. "A review on the recent developments of solution processes for oxide thin film transistors," Semiconductor Science and Technology, vol. 30, No. 6, May 8, 2015, 15 pages.
European International Search Report issued to 19757893.3, dated Aug. 10, 2021.
European International Search Report issued to 19764212.7 dated Aug. 11, 2021.
Japanese Office Action for Application No. 2020-525886 dated Aug. 31, 2021.
Japanese Office Action for Application No. 2020-547132 dated Nov. 10, 2021.
Japanese Office Action for Application No. 2020-500629 dated Oct. 12, 2021.
Korean Office Action dated Nov. 23, 2021, for Korean Patent Application No. 10-2021-7031756.
Chinese Patent Application No. 201880074319.5, Office Action and Search Report dated Nov. 24, 2021, 14 pages.
KR Office Action dated Nov. 23, 2021, for Korean Patent Application No. 10-2021-7031754.
KR Office Action dated Dec. 14, 2021 for Application No. 10-2020-7027144.

(56) References Cited

OTHER PUBLICATIONS

PCT Notification of Transmittal of the International Search Report and the Written Opinion of the International Searching Authority for International Application No. PCT/US2019/061995; dated Mar. 9, 2020; 13 total pages.
Japanese Office Action dated Mar. 17, 2020, for Japanese Patent Application No. 2019-073230.
International Search Report and Written Opinion dated Aug. 24, 2017 for Application No. PCT/US2017/033862.
International Search Report and Written Opinion for PCT/US2018/043160 dated Jan. 31, 2019.
International Search Report PCT/2020/046396 dated Nov. 26, 2020, 12 pages.
Japanese Office Action for Application No. 2018-564195 dated Nov. 19, 2019.
Korean Office Action dated Aug. 4, 2020, for Korean Patent Application No. 10-2019-0040236.
Taiwan Office Action dated Jul. 28, 2021 for Application No. 107108016.
Lin, Kevin L. et al.—"Nickel silicide for interconnects", 2015 IEEE International Interconnect Technology Conference and 2015 IEEE Materials for Advanced Metallization Conference (IITC/MAM), IEEE, (XP032808874), May 18, 2015, pp. 169-172.
Taiwan Office Action for Application No. 106119184 dated Mar. 6, 2019.
T. Miyake et al., "Effects of atomic hydrogen on Cu reflow process", AIP Conference Proceedings 418, 419 (1998).
Japanese Office Action dated Nov. 10, 2020, for Japanese Patent Application No. 2019-073230.
Office Action for Japanese Patent Application No. 2020-543976 dated Jul. 13, 2021.
International Search Report and Written Opinion for PCT/US2021/014991 dated May 17, 2021.
Taiwan Office Action dated Mar. 31, 2020, for Taiwan Patent Application No. 108111883.
International Search Report and Written Opinion for International Application No. PCT/US2019/032609 dated Sep. 11, 2019.
International Search Report and Written Opinion for PCT/US2018/059643 dated Feb. 26, 2019.
Korean Office Action dated Aug. 26, 2021, for Korean Patent Application No. 10-2020-4016526.

* cited by examiner

HIGH PRESSURE AND HIGH TEMPERATURE ANNEAL CHAMBER

CROSS-REFERENCE TO RELATED APPLICATIONS

This application is a continuation of U.S. patent application Ser. No. 16/378,140, filed Apr. 8, 2019, which is a divisional of U.S. patent application Ser. No. 15/681,317, filed Aug. 18, 2017, each of which is herein incorporated by reference in its entirety.

BACKGROUND

Field

Embodiments of the disclosure generally relate to fabrication of integrated circuits and particularly to an apparatus and method for annealing one or more semiconductor substrates.

Description of the Related Art

Formation of a semiconductor device, such as memory devices, logic devices, microprocessors etc. involves deposition of one or more films over a semiconductor substrate. The films are used to create the circuitry required to manufacture the semiconductor device. Annealing is a heat treatment process used to achieve various effects on the deposited films to improve their electrical properties. For example, annealing can be used to activate dopants, densify the deposited films, or change states of grown films.

Semiconductor device geometries have dramatically decreased in size since their introduction several decades ago. Increasing device densities have resulted in structural features having decreased spatial dimensions. For example, the aspect ratio (ratio of depth to width) of gaps and trenches forming the structural features of modern semiconductor devices have narrowed to a point where filling the gap with material has become extremely challenging.

Thus, there is a need for an improved apparatus and method for annealing semiconductor substrates that can accommodate the challenges associated with manufacturing modern semiconductor devices.

SUMMARY

Embodiments of the disclosure relate to an apparatus and method for annealing semiconductor substrates. In one embodiment, a processing chamber is disclosed. The processing chamber includes a chamber body enclosing an internal volume, a substrate support disposed in the internal volume and configured to support a substrate during processing, a gas panel configured to provide a processing fluid into the internal volume, and a temperature-controlled fluid circuit configured to maintain the processing fluid at a temperature above a condensation point of the processing fluid. The temperature-controlled fluid circuit includes a gas conduit fluidly coupled to a port on the chamber body at a first end and to the gas panel at a second end.

In another example, a processing chamber includes a chamber body enclosing an internal volume, a substrate support disposed in the internal volume and configured to support a substrate during processing, one or more chamber heaters operable to maintain the internal volume at a temperature above 300 degrees Celsius, a gas panel configured to provide a dry steam into the internal volume, one or more heat shields coupled to the chamber body and disposed around the internal volume, a condenser fluidly connected to the internal volume, the condenser configured to condense the dry steam, and a temperature-controlled fluid circuit coupling the internal volume of the chamber body to the gas panel. The temperature-controlled fluid circuit configured to maintain the dry steam at a temperature above a condensation point of the dry steam.

In another example, a method of annealing one or more substrates in a processing chamber is provided. The method includes loading the one or more substrates into an internal volume of the processing chamber, flowing a processing fluid through a gas conduit into the internal volume, and maintaining the processing fluid in the gas conduit and the internal volume at a temperature above a condensation point of the processing fluid.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures.

It is contemplated that elements and features of one embodiment may be beneficially incorporated in other embodiments without further recitation.

DETAILED DESCRIPTION

Embodiments of the disclosure relate to an apparatus and method for annealing one or more semiconductor substrates. The substrates may be annealed as a single substrate or in batches inside a single chamber. The substrates are exposed to a processing fluid under high pressure at a high temperature during annealing. The processing fluid is flowed from a gas panel through a temperature-controlled fluid circuit into a chamber when the one or more substrates are processed. The processing fluid is maintained at a temperature above the condensation point of the processing fluid by one or more heaters coupled to the fluid circuit. The fluid circuit is coupled to a condenser, where the processing fluid is condensed into liquid phase after annealing is complete. The heaters on the fluid circuit are controlled using information from temperature measurements obtained through temperature sensors interfaced with different portions of the fluid circuit. A batch processing chamber 100 shown in FIG. 1 and described herein, as well as a single-substrate processing chamber 200 shown in FIG. 2 and described herein, can be utilized for the purpose of performing the high-pressure annealing process at high temperatures.

Figure 1:
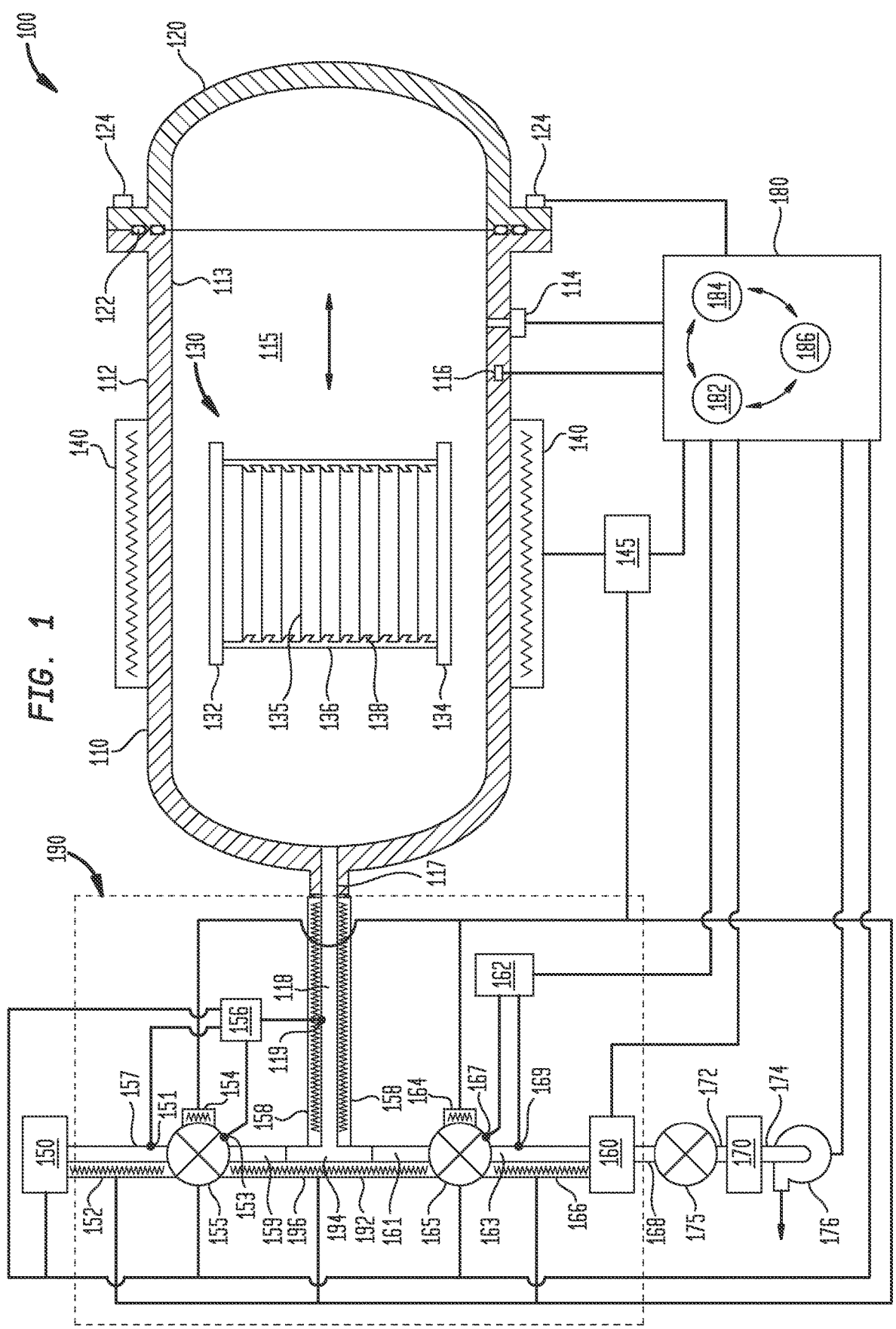
FIG. 1 is a simplified front cross-sectional view of a batch processing chamber for annealing one or more substrates.

FIG. 1 is simplified front cross-sectional view of a batch processing chamber 100 for a high-pressure annealing process at a high temperature. The batch processing chamber 100 has a body 110 with an outer surface 112 and an inner surface 113 that encloses an internal volume 115. In some embodiments such as in FIG. 1, the body 110 has an annular cross section, though in other embodiments the cross-section of the body 110 may be rectangular or any closed shape. The outer surface 112 of the body 110 may be made from a corrosion resistant steel (CRS), such as but not limited to stainless steel. The outer surface 112 may be optionally covered with a layer of thermal insulation that prevents loss of heat from the batch processing chamber 100 into the outside environment. The inner surface 113 of the body 110 may be made from or covered with nickel-based steel alloys that exhibit high resistance to corrosion, such as but not limited to HASTELLOY®, ICONEL®, and MONEL®. Optionally, the body 110 may be fabricated from a nickel-based steel alloy.

The batch processing chamber 100 has a door 120 configured to sealably enclose the internal volume 115 within the body 110 such that substrates may be transferred in and out of the internal volume 115 when the door 120 is open. A high-pressure seal 122 is utilized to seal the door 120 to the body 110 during processing. The high-pressure seal 122 may be made from a high-temperature polymer, such as but not limited to a perfluoroelastomer. A cooling channel 124 is disposed in the door 120 or the body 110 adjacent to the high-pressure seals 122 in order to maintain the high-pressure seals 122 below the maximum safe-operating temperature of the high-pressure seals 122. A cooling agent, such as but not limited to an inert, dielectric, and high-performance heat transfer fluid, may be circulated within the cooling channel 124. The flow of the cooling agent within the cooling channel 124 is controlled by a controller 180 through feedback received from a temperature sensor 116 or a flow sensor (not shown).

An anti-convection panel may be placed between the door 120 and the cassette 130. The anti-convection panel separates the internal volume 115 into a hot processing region in which the cassette 130 resides and a cooler region proximate the door 120. The anti-convection panel is generally a metal plate fabricated from the same materials as the chamber body 110. The anti-convection panel may be coupled to the door 120, the cassette 130 or other suitable structure. The anti-convection panel may include a face facing the cassette 130 that is configured to reduce the amount of heat transfer from the region in which the cassette 130 resides to the region of the body 110 proximate the door 120. The face may be large enough to inhibit convection between the hot processing and cooler regions. The face may also have a polished surface or heat reflecting coating. The anti-convection panel causes portions of the chamber body 110 bounding the cooler region to be shielded from and maintained at temperatures less than those of the portions of the chamber body 110 bounding the hot processing region. Thus, seals 122 proximate the door 120 and contacting the portions of the chamber body 110 bounding the cooler region are less likely to fail due to exceeding their maximum operational temperatures.

The batch processing chamber 100 has a port 117 formed through the body 110. The port 117 is fluidly connected to a temperature-controlled fluid circuit 190. The fluid circuit 190 connects a gas panel 150, a condenser 160 and the port 117. The fluid circuit 190 has a gas conduit 192, a source conduit 157, an inlet isolation valve 155, an exhaust conduit 163, and an outlet isolation valve 165. One or more heaters 152, 154, 158, 196, 164, 166 are interfaced with different portions of the fluid circuit 190. One or more temperature sensors 151, 153, 119, 167 and 169 are interfaced with different portions of the fluid circuit 190 to obtain temperature measurements and provide the temperature measurement information to the controller 180.

The gas conduit 192 is fluidly connected to the internal volume 115 through the port 117 at one end. The gas conduit 192 has four portions that include a chamber conduit 118, a T-conduit 194, an inlet conduit 159 and an outlet conduit 161. The T-conduit 194 has three ends: a first end connected to the inlet conduit 159, a second end connected to the outlet conduit 161 and a third end connected to the chamber conduit 118. The chamber conduit 118 is fluidly connected to the internal volume 115 via the port 117. The inlet conduit 159 is fluidly connected to the source conduit 157 via the inlet isolation valve 155. The outlet conduit 161 is fluidly connected to the exhaust conduit 163 via the outlet isolation valve 165. The source conduit 157 is fluidly coupled to the gas panel 150. The exhaust conduit 163 is fluidly coupled to the condenser 160.

The chamber conduit 118 is interfaced with the heater 158. The T-conduit 194, the inlet conduit 159 and the outlet conduit 161 are interfaced with the heater 196. The source conduit 157 is interfaced with the heater 152. The inlet isolation valve 155 is interfaced with the heater 154. The outlet isolation valve 165 is interfaced with the heater 164. The exhaust conduit 163 is interfaced with the heater 166. The heaters 152, 154, 158, 196, 164, and 166 are configured to maintain a processing fluid flowing through the fluid circuit 190 at a temperature above the condensation point of the processing fluid. For example, the heaters 152, 154, 158, 196, 164, and 166 may be configured to maintain a processing fluid flowing through the fluid circuit 190 at a temperature which maintains the processing fluid as dry steam or superheated steam. The heaters 152, 154, 158, 196, 164, and 166 may be optionally covered with a layer of thermal insulation to prevent loss of heat into the outside environment. The heaters 152, 154, 158, 196, 164, and 166 may be lamps, resistive heating elements, fluid conduits for flowing a transfer fluid or other suitable heating devices. In one embodiment, the heaters are resistive strips wound around the elements of the fluid circuit. The heaters 152, 154, 158, 196, 164, and 166 are individually coupled to a power source 145. In one embodiment, each of the heaters 152, 154, 158, 196, 164, and 166 may be independently controlled.

The temperature sensor 151 is interfaced with the source conduit 157 and configured to measure the temperature of the source conduit 157. The temperature sensor 153 is interfaced with the inlet isolation valve 155 and configured to measure the temperature of the inlet isolation valve 155. The temperature sensor 119 is interfaced with the chamber conduit 118 and configured to measure the temperature of the chamber conduit 118. A temperature reading device 156 receives and displays the temperature measurements from the temperature sensors 151, 153 and 119. The temperature sensor 167 is interfaced with the outlet isolation valve 165 and configured to measure the temperature of the outlet isolation valve 165. The temperature sensor 169 is interfaced with the exhaust conduit 163 and configured to measure the temperature of the exhaust conduit 163. A temperature reading device 162 receives and displays the temperature measurements from the temperature sensors 167 and 169. The temperature reading devices 156 and 162 send the temperature measurement information to the controller 180. The sensors 151, 153, 119, 167 and 169 may be a noncontact sensor, such as an infra-red sensor, or a contact sensor, such as a thermocouple.

The inlet isolation valve 155 and the outlet isolation valve 165 are shutoff valves. When the inlet isolation valve 155 is open, the outlet isolation valve 165 is closed such that a processing fluid flowing through source conduit 157 enters into the gas conduit 192 and the internal volume 115, preventing the flow of the processing fluid into the condenser 160. On the other hand, when the outlet isolation valve 165 is open, the inlet isolation valve 155 is closed such that a gaseous product is removed from the internal volume 115 and flows through the exhaust conduit 163 and into the condenser 160, preventing the flow of the gaseous product into the gas panel 150.

Figure 3:
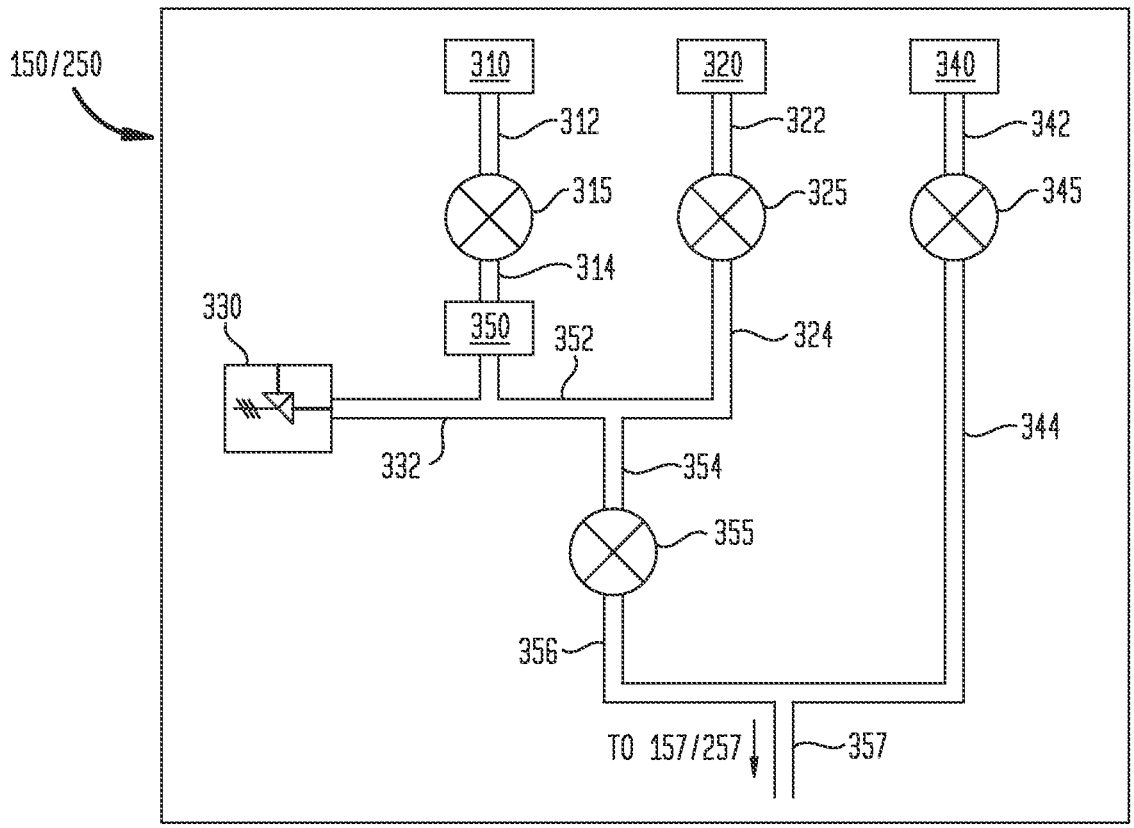
FIG. 3 is a simplified schematic of a gas panel used in the batch processing chamber and the single-substrate chamber.

The gas panel 150 is configured to provide a processing fluid under pressure into the source conduit 157 for transmission into the internal volume 115 through the gas conduit 192. As shown in FIG. 3, the gas panel 150 includes a processing fluid inlet 310, an optional inert gas inlet 320, a purge gas inlet 340 and a common outlet conduit 357. The processing fluid inlet 310 is fluidly connected to a fluid source (not shown). The fluid source may provide water or other suitable fluid that is heated to a gas phase and utilized as the processing fluid. The processing fluid inlet 310 is fluidly connected to a vaporizer 350 by conduits 312, 314, and an isolation valve 315. The isolation valve 315 has a first (i.e., closed) state that prevent flow from the fluid source from entering the vaporizer 350. The isolation valve 315 has a second (i.e., open) state that allows flow from the fluid source to enter the vaporizer 350. The isolation valve 315 is also be configured or utilized with a mass flow meter to regulate the amount of processing fluid flowing into the vaporizer 350. The vaporizer 350 is configured to convert the processing fluid into a gas phase. In one example, the vaporizer 350 converts water into steam. In one example, the vaporizer 350 converts water into dry steam or superheated steam.

The vaporizer 350 is fluidly connected to a common inlet conduit 354 by a conduit 352. The vaporizer 350 and the common inlet conduit 354 are also fluidly connected to a pressure safety valve 330 by a conduit 332. The pressure safety valve 330 is configured to release excess pressure in the conduit 352 and is generally known in the art.

The optional inert gas inlet 320 is configured to provide a pressure control gas from a pressure control gas source (not shown) that is utilized to control the pressure of the processing fluid delivered through the common inlet conduit 354. The pressure control gas provided by the gas source may be a reactive gas or an inert gas, such as but not limited to nitrogen, argon, and the like, or other suitable gas(es). The inert gas inlet 320 is fluidly connected to the common inlet conduit 354 by an isolation valve 325 and conduits 322, 324. The isolation valve 325 has a first (i.e., closed) state that prevent flow from the pressure control gas source from entering the common inlet conduit 354 through the conduit 324. The isolation valve 325 has a second (i.e., open) state that allows flow from the pressure control gas source to enter the common inlet conduit 354 through the conduit 324. The isolation valve 325 is also be configured or utilized with a mass flow meter to regulate the amount of pressure control gas flowing into the common inlet conduit 354.

The common inlet conduit 354 is fluidly connected to the common outlet conduit 357 by a valve 355 and a conduit 356. The valve 355 may be configured as an isolation valve to selectively isolate the vaporizer 350 and the inert gas inlet 320 from the fluid circuit 190. The common outlet conduit 357 is fluidly connected to the source conduit 157 coupling the gas panel 150 to the inlet isolation valve 155. In another example, the valve 355 may be configured as a flow control valve to selectively control the amount of processing fluid the vaporizer 350 and the inert gas inlet 320 flowing from the fluid circuit 190 into the internal volume 115 of the chamber body 110. Examples of flow control valves include needle valves, throttle valves, and modulating valves, among others.

A purge gas inlet 340 is also coupled to the source conduit 157 through the common outlet conduit 357. The purge gas inlet 340 is coupled to a source of purge gas (not shown). The purge gas may be an inert gas, such as but not limited to nitrogen, air, argon, and the like. The purge gas may be utilized to remove residuals of the processing fluid from the common outlet conduit 357 and the fluid circuit 190, when desired. The purge gas inlet 340 is fluidly connected to the common outlet conduit 357 by an isolation valve 345. The purge gas inlet 340 is fluidly connected to the isolation valve 345 by a conduit 342. The isolation valve 345 is configured to selectively isolate the purge gas inlet 340 from the common outlet conduit 357. The isolation valve 345 is fluidly connected to the common outlet conduit 357 by a conduit 344.

In some embodiments, the isolation valves 315, 325, 345 and 355 are shutoff valves. The operation of the isolation valves 315, 325, 345 and 355 are controlled by the controller 180. The pressure of the processing fluid introduced into the internal volume 115 is monitored by a pressure sensor 114 coupled to the body 110. As the fluid circuit 190 is continuously coupled to the internal volume 115, the pressure sensor 114 may also be utilized to determine the pressure within the fluid circuit 190. In embodiments where the fluid circuit 190 and the internal volume 115 have an isolation valve disposed therebetween or are configured such that a significant variation in pressure is expected, each of the fluid circuit 190 and the internal volume 115 may be equipped with separate pressure sensors 114.

The condenser 160 is fluidly coupled to a cooling fluid source (not shown) and configured to condense the gas phase processing fluid exiting the internal volume 115 through the gas conduit 192. The phase change in the condenser 160 pulls the processing fluid from the internal volume 115 and fluid circuit 190, which minimizes the need of purging gases. Optionally, condensed processing fluid exiting the condenser 160 may be routed through a heat exchanger 170 via an isolation valve 175. The heat exchanger 170 is configured to further cool the condensed processing fluid so that the processing fluid may be more easily managed. The condenser 160 is fluidly connected to the isolation valve 175 by a condenser conduit 168. The heat exchanger 170 is coupled to the isolation valve 175 by a heat exchanger conduit 172. A pump 176 is fluidly connected to the heat exchanger 170 by a pump conduit 174 and pumps out the liquefied processing fluid from the heat exchanger 170 to a container for recycling, reuse or disposal.

One or more heaters 140 are disposed on the body 110 and configured to heat the body 110 of the batch processing chamber 100. In some embodiments, the heaters 140 are disposed on an outer surface 112 of the body 110 as shown in FIG. 1. Each of the heaters 140 may be a resistive coil, a lamp, a ceramic heater, a graphite-based carbon fiber composite (CFC) heater, a stainless steel heater or an aluminum heater. The heaters 140 are powered by the power source 145. Power to the heaters 140 is controlled by the controller 180 through feedback received from a temperature sensor 116. The temperature sensor 116 is coupled to the body 110 and monitors the temperature of the body 110. In one example, the heaters 140 maintain the body 110 at a temperature above the condensation point of the processing fluid disposed in the internal volume 115.

One or more heaters (not shown) are disposed in the body 110 and configured to heat the substrates 135 disposed in the cassette 130 while in the internal volume 115 of the batch processing chamber 100. Each of the heaters may be a resistive coil, a lamp, a ceramic heater, a graphite-based carbon fiber composite (CFC) heater, a stainless steel heater or an aluminum heater. In the embodiment depicted in FIG. 1, the heaters are resistive heaters. The heaters are powered by the power source 145. Power to the heaters is controlled by the controller 180 through feedback received from a temperature sensor (not shown). The temperature sensor may be disposed in the body 110 and monitor the temperature of the internal volume 115. In one example, the heaters are operable to maintain the substrates 135 disposed in the cassette 130 while in the hot processing region of the internal volume 115 of the batch processing chamber 100 at a temperature above 300 degrees Celsius, such as between 300 and about 450 degrees Celsius, or even such as between 300 and about 500 degrees Celsius.

Since the heaters generally maintain the hot processing region of the internal volume 115 at a temperature significantly above the temperature of the fluid circuit 190, the dry steam exiting the fluid circuit 190 into the hot processing region becomes superheated. The superheated dry steam advantageously will not condensate within the hot processing region, then preventing fluid from condensing on the substrates 135 being processed within the processing chamber 100.

A cassette 130 coupled to an actuator (not shown) is moved in and out of the internal volume 115. The cassette 130 has a top surface 132, a bottom surface 134, and a wall 136. The wall 136 of the cassette 130 has a plurality of substrate storage slots 138. Each substrate storage slot 138 is evenly spaced along the wall 136 of the cassette 130. Each substrate storage slot 138 is configured to hold a substrate 135 therein. The cassette 130 may have as many as fifty substrate storage slots 138 for holding the substrates 135. The cassette 130 provides an effective vehicle both for transferring a plurality of substrates 135 into and out of the batch processing chamber 100 and for processing the plurality of substrates 135 in the internal volume 115.

The controller 180 includes a central processing unit (CPU) 182, a memory 184, and a support circuit 186. The CPU 182 may be any form of a general purpose computer processor that may be used in an industrial setting. The memory 184 may be a random access memory, a read-only memory, a floppy, or a hard disk drive, or other form of digital storage. The support circuit 186 is conventionally coupled to the CPU 182 and may include cache, clock circuits, input/output systems, power supplies, and the like.

The controller 180 controls the operation of various components of the batch processing chamber 100. The controller 180 controls the operation of the gas panel 150, the condenser 160, the pump 176, the inlet isolation valve 155, the outlet isolation valve 165 and the power source 145. The controller 180 is also communicatively connected to the temperature sensor 116, the pressure sensor 114, the cooling channel 124 and the temperature reading devices 156 and 162. The controller 180 receives as an input the type of processing fluid selected for the treating the substrates. Once the type of processing fluid is received by the controller 180, the controller 180 determines target pressure and temperature range which maintains the processing fluid in a gaseous state. The controller 180 uses information from the temperature sensors 116, 151, 153, 119, 167, 169 and the pressure sensor 114 to control the operation of heaters 140, 152, 154, 158, 196, 164, and 166 and the pressure provided within the internal volume 115 and fluid circuit 190. The controlled heat supplied by the heaters and pressure provided by the pressure control gas is utilized to maintain the processing fluid disposed in the fluid circuit 190 and the internal volume 115 at a temperature greater than the condensation point of the processing fluid for the applied pressure and temperature. The controller 180 uses information from the pressure sensor 114 to control the operation of the isolation valves 315, 325, 345 and 355 in the gas panel 150 to optimally supply the processing fluid into the fluid circuit 190 and maintain the processing fluid at a pressure less than the condensation pressure of the processing fluid at the applied temperature. The temperature and pressure of the internal volume 115 as well as the fluid circuit 190 are thus maintained such that the processing fluid stays in the gaseous phase.

It is contemplated that the processing fluid is selected according to the process requirements for the desired annealing of the substrates in the batch processing chamber 100. The processing fluid may comprise an oxygen-containing and/or nitrogen-containing gas, such as oxygen, steam, water, hydrogen peroxide, and/or ammonia. Alternatively or in addition to the oxygen-containing and/or nitrogen-containing gases, the processing fluid may comprise a silicon-containing gas such as but not limited to organosilicon, tetraalkyl orthosilicate gases and disiloxane gases. In some embodiments, the processing fluid may be steam or dry steam under pressure between about 5 bars and about 80 bars and the temperature may be maintained between about 150 degrees Celsius and about 250 degrees Celsius or even as much as 500 degrees Celsius. This ensures that the dry steam does not condense into water in the internal volume 115 and the fluid circuit 190, and additionally allows the dry steam to become superheated dry steam within the hot processing region in which the substrates 135 are exposed to the superheated dry steam for processing.

Another batch processing chamber including connections to a temperature-controlled fluid circuit is now described. The batch processing chamber is essentially the same as the batch processing chamber 100 described above, except instead of a single port 117 coupling the temperature-controlled fluid circuit 190 to both the condenser 160 and gas panel 150 as shown in FIG. 1, the batch processing chamber may alternatively include a first port coupling the internal volume 115 to the gas panel 150 of the temperature-controlled fluid circuit, and a second port coupling the internal volume 115 to the condenser 160 of the temperature-controlled fluid circuit.

A temperature-controlled fluid circuit essentially identical to the temperature-controlled fluid circuit 190 is now described, with the subscripts A and B denoting elements that are coupled to the gas panel side (A) and the condenser side (B). Unlike the temperature-controlled fluid circuit 190 that fluidly couples the condenser 160 and gas panel 150 within the temperature-controlled fluid circuit 190 through a common chamber conduit 118 to the internal volume 115 of the chamber body 110, the temperature-controlled fluid circuit fluidly isolates the condenser 160 and the gas panel 150 and separately couples the condenser 160 and the gas panel 150 through separate chamber conduits $118_{A,B}$ to the internal volume 115 of the chamber body 110 through separate dedicated ports $117_{A,B}$.

Figure 2:
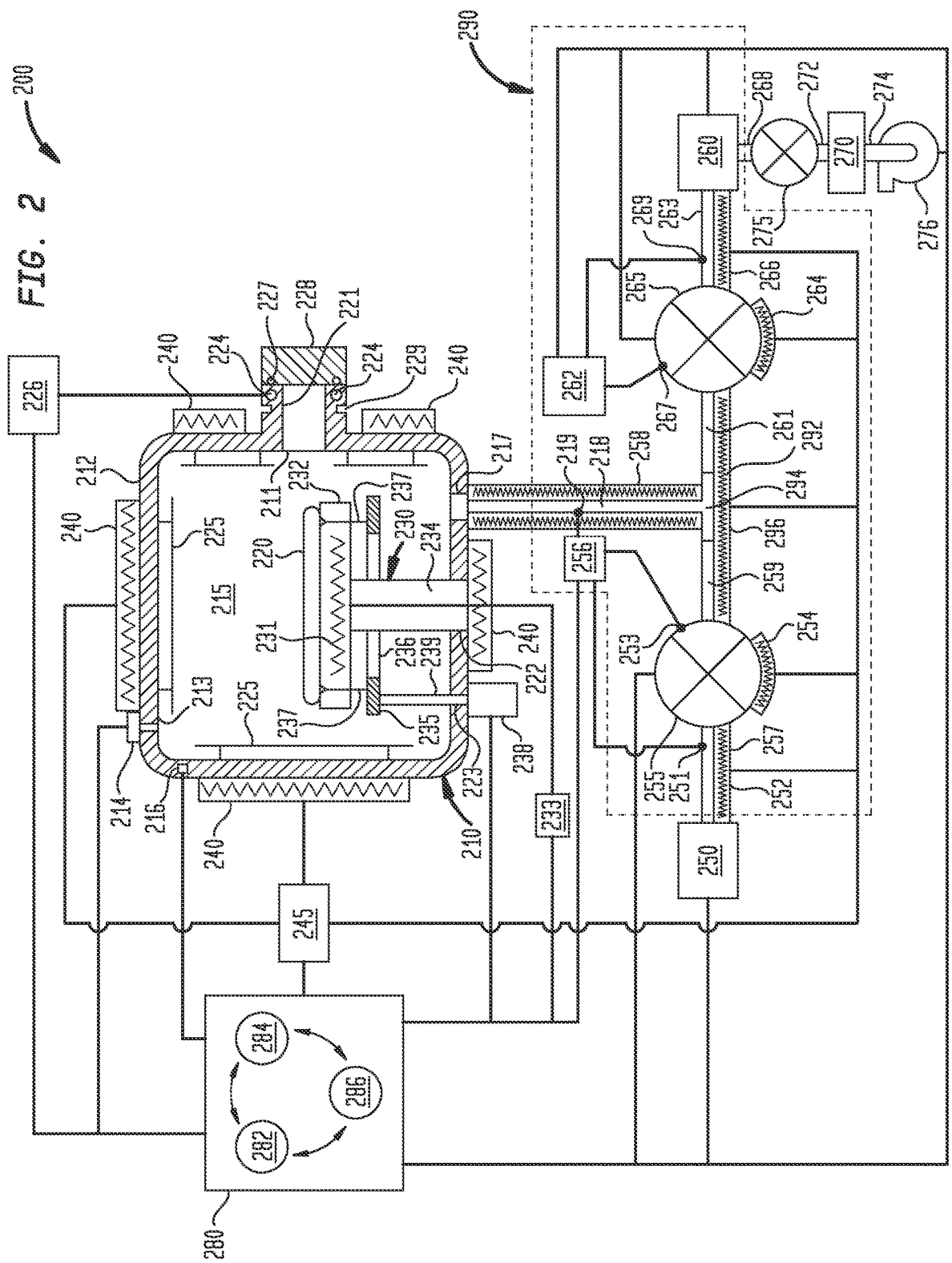
FIG. 2 is a simplified front cross-sectional view of a single-substrate processing chamber for annealing a single substrate.

FIG. 2 is a simplified front cross-sectional view of a single-substrate processing chamber 200 for a high-pressure annealing process of a single substrate at a high temperature. The single-substrate processing chamber 200 has a body 210 with an outer surface 212 and an inner surface 213 that encloses an internal volume 215. In some embodiments such as in FIG. 2, the body 210 has an annular cross section, though in other embodiments the cross-section of the body 210 may be rectangular or any closed shape. The outer surface 212 of the body 210 may be made from a corrosion resistant steel (CRS), such as but not limited to stainless steel. One or more heat shields 225 are disposed on the inner surface 213 of the body 210 that prevents heat loss from the single-substrate processing chamber 200 into the outside environment. The inner surface 213 of the body 210 as well as the heat shields 225 may be made from nickel-based steel alloys that exhibit high resistance to corrosion, such as but not limited to HASTELLOY®, ICONEL®, and MONEL®.

A substrate support 230 is disposed within the internal volume 215. The substrate support 230 has a stem 234 and a substrate-supporting member 232 held by the stem 234. The stem 234 passes through a passage 222 formed through the chamber body 210. A rod 239 connected to an actuator 238 passes through a second passage 223 formed through the chamber body 210. The rod 239 is coupled to a plate 235 having an aperture 236 accommodating the stem 234 of the substrate support 230. Lift pins 237 are connected to the substrate-supporting member 232. The actuator 238 actuates the rod 239 such that the plate 235 is moved up or down to connect and disconnect with the lift pins 237. As the lift pins 237 are raised or lowered, the substrate-supporting member 232 is raised or lowered within the internal volume 215 of the chamber 200. The substrate-supporting member 232 has a resistive heating element 231 embedded centrally within. A power source 233 is configured to electrically power the resistive heating element 231. The operation of the power source 233 as well as the actuator 238 is controlled by a controller 280.

The single-substrate processing chamber 200 has an opening 211 on the body 210 through which one or more substrates 220 can be loaded and unloaded to and from the substrate support 230 disposed in the internal volume 215. The opening 211 forms a tunnel 221 on the body 210. A slit valve 228 is configured to sealably close the tunnel 221 such that the opening 211 and the internal volume 215 can only be accessed when the slit valve 228 is open. A high-pressure seal 227 is utilized to seal the slit valve 228 to the body 210 in order to seal the internal volume 215 for processing. The high-pressure seal 227 may be made from a polymer, for example a fluoropolymer, such as but not limited to a perfluoroelastomer and polytetrafluoroethylene (PTFE). The high-pressure seal 227 may further include a spring member for biasing the seal to improve seal performance. A cooling channel 224 is disposed on the tunnel 221 adjacent to the high-pressure seals 227 in order to maintain the high-pressure seals 227 below the maximum safe-operating temperature of the high-pressure seals 227 during processing. A cooling agent from a cooling fluid source 226, such as but not limited to an inert, dielectric, and high-performance heat transfer fluid, may be circulated within the cooling channel 224. The flow of the cooling agent from the cooling fluid source 226 is controlled by the controller 280 through feedback received from a temperature sensor 216 or a flow sensor (not shown). An annular-shaped thermal choke 229 is formed around the tunnel 221 to prevent the flow of heat from the internal volume 215 through the opening 211 when the slit valve 228 is open.

The single-substrate processing chamber 200 has a port 217 through the body 210, which is fluidly connected to a fluid circuit 290 connecting the gas panel 250, the condenser 260 and the port 217. The fluid circuit 290 has substantially similar components as the fluid circuit 190 and functions in a substantially similar way as the fluid circuit 190. The fluid circuit 290 has a gas conduit 292, a source conduit 257, an inlet isolation valve 255, an exhaust conduit 263, and an outlet isolation valve 265. A number of heaters 296, 258, 252, 254, 264, 266 are interfaced with different portions of the fluid circuit 290. A number of temperature sensors 251, 253, 219, 267 and 269 are also placed at different portions of the fluid circuit 290 to take temperature measurements and send the information to the controller 280. The controller 280 uses the temperature measurement information to control the operation of the heaters 252, 254, 258, 296, 264, and 266 such that the temperature of the fluid circuit 290 is maintained at a temperature above the condensation point of the processing fluid disposed in the fluid circuit 290 and the internal volume 215.

The gas panel 250 and the pressure sensor 214 are substantially similar in nature and function as the gas panel 150 and the pressure sensor 114. The condenser 260 is substantially similar in nature and function as the condenser 160. The pump 270 is substantially similar in nature and function as the pump 176. One or more heaters 240 are disposed on the body 210 and configured to heat the internal volume 215 within the single-substrate processing chamber 200. The heaters 240 are also substantially similar in nature and function as the heaters 140 used in the batch processing chamber 100.

The controller 280 controls the operation of the single-substrate processing chamber 200. The controller 280 controls the operation of the gas panel 250, the condenser 260, the pump 270, the inlet isolation valve 255, the outlet isolation valve 265, the power sources 233 and 245. The controller 280 is also communicatively connected to the temperature sensor 216, the pressure sensor 214, the actuator 238, the cooling fluid source 226 and the temperature reading devices 256 and 262. The controller 280 is substantially similar in nature and function than the controller 180 used in the batch processing chamber 100.

The batch processing chamber 100 provides a convenient processing chamber to perform the method of annealing one or more substrates at a high temperature using a processing fluid under high pressure. The heaters 140 are powered on to heat the processing chamber 100 and maintain the internal volume 115 at a temperature above the condensation point of the processing fluid. At the same time, the heaters 152, 154, 158, 196, 164, and 166 are powered on to heat the fluid circuit 190.

A plurality of substrates 135 are loaded on the cassette 130 to be placed in the batch processing chamber 100. The door 120 of the batch processing chamber 100 is opened and the cassette 130 is moved into the internal volume 115. The door 120 is then closed to seal the substrates 135 within the processing chamber 100. A seal 122 ensure that there is no leakage from the internal volume 115 once the door 120 is closed.

A processing fluid is provided by the gas panel 150 into the internal volume 115 defined inside the processing chamber 100. The inlet isolation valve 155 is opened to allow the processing fluid to flow through the source conduit 157 and the gas conduit 192 into the internal volume 115. The outlet isolation valve 165 is kept closed at this time. The pressure at which the processing fluid is applied may be increased incrementally. The inlet isolation valve 155 is closed when a sufficient amount of processing fluid is present in the internal volume 115. Alternatively, the processing fluid may be continuously flowed through the internal volume 115 while processing the substrates 135.

During processing, the internal volume 115 as well as the fluid circuit 190 are maintained at a temperature and pressure such that the processing fluid is maintained in a gaseous phase. The temperatures of the internal volume 115 as well as the fluid circuit 190 are maintained at a temperature greater than the condensation point of the processing fluid at the applied pressure. The internal volume 115 as well as the fluid circuit 190 are maintained at a pressure less than the condensation pressure of the processing fluid at the applied temperature.

The processing is complete when the substrates 135 have achieved the desired effect through exposure to the processing fluid at the processing condition. The outlet isolation valve 165 is then opened to flow the processing fluid from the internal volume 115 through the gas conduit 192 and exhaust conduit 163 into the condenser 160. The processing fluid is condensed into a liquid phase in the condenser 160. The optional heat exchanger 170 may further cool the liquid phase processing fluid to ease in handling of the fluid. The condensed processing fluid is then removed by the pump 176. When the condensed processing fluid is removed, the outlet isolation valve 165 closes. The heaters 140, 152, 154, 158, 196, 164, and 166 maintain the processing fluid within the fluid circuit in a gaseous phase while the outlet isolation valve 165 to the condenser 160 is open to prevent condensation within the fluid circuit. The door 120 of the batch processing chamber 100 is then opened to remove the substrates 135 from the internal volume 115.

The single-substrate processing chamber 200 operates in substantially the same manner as the batch processing chamber 100. The single-substrate processing chamber 200 is used to anneal a single substrate 220 placed on the substrate support 230. The slit valve 228 is opened to load the substrate 220 through the tunnel 221 to the substrate support 230 in the internal volume 215. The heaters 252, 254, 258, 296, 264, and 266 maintain the processing fluid within the fluid circuit in a gaseous phase while delivered to the internal volume 215.

Figure 4:
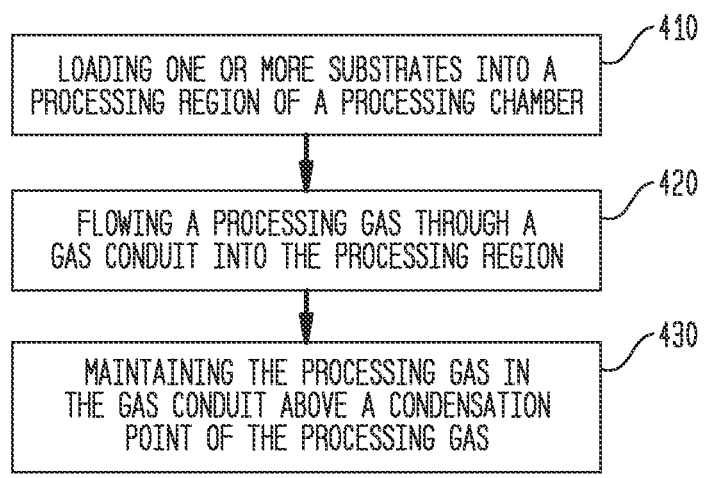
FIG. 4 is a block diagram of a method of annealing one or more substrates in a processing chamber.

FIG. 4 is a block diagram of a method of annealing one or more substrates in a processing chamber, according to one embodiment of the present disclosure. The method begins at block 410 by loading one or more substrates into a processing region of the processing chamber. For example, a single substrate can be loaded on a substrate support disposed in a single-substrate processing chamber. Otherwise, a plurality of substrates can be loaded on a cassette placed into a batch processing chamber.

At block 420, a processing fluid is flowed through a gas conduit into the processing region within the single-substrate processing chamber or the batch processing chamber. In some embodiments, the processing fluid may be a processing fluid under high pressure. The single substrate or the plurality of substrates is exposed to the processing fluid at a high temperature during the annealing process. After processing is complete, the processing fluid is removed from the processing region through the gas conduit and condensed by a condenser into a liquid phase. The condensed processing fluid is subsequently removed by a pump.

At block 430, the processing fluid in the gas conduit is maintained at a temperature above a condensation point of the processing fluid. The gas conduit is coupled to one or more heaters configured to maintain the processing fluid flowing through the gas conduit at a temperature above the condensation point of the processing fluid such that the processing fluid remains in a gaseous phase. In some embodiments, the heaters may comprise a resistive heating element powered by a power source. The gas conduit has one or more temperature sensors operable to measure a temperature of the gas conduit. The temperature measurements from the gas conduit are sent to a controller which uses the information to control the operation of the heaters on the gas conduit.

The type of the processing fluid selected for the treating the substrates in inputted into a user interface of the controller or by provided to the controller via another channel. The controller uses information from the temperature and pressure sensors to control the operation of heaters interfaced with different portions of the fluid circuit and the chamber body and maintain the processing fluid present in the fluid circuit and the processing region at a temperature greater than the condensation point of the processing fluid for the sensed pressure. The controller also uses information from the temperature and pressure sensors coupled to the chamber body to control the flow of processing fluid and pressure control gas from a gas panel into the fluid circuit and maintain the processing fluid at a pressure less than the condensation pressure of the processing fluid at the sensed temperature. The temperature and pressure of the processing region as well as the fluid circuit are thus maintained such that the processing fluid remains in the gaseous phase. In one example, the pressure is maintained between about 5 bars and about 35 bars while the temperature is be maintained between about 150 degrees Celsius and about 250 degrees Celsius so that processing fluid predominantly in the form steam remains in a gas phase.

The fluid circuit 190, 290 used in the processing chambers 100, 200 offers the advantage of controlling and maintaining the temperature of a processing fluid above the condensation point of the processing fluid flowing through the fluid circuit 190, 290 into a high-pressure annealing chamber. A number of heaters and temperature sensors coupled to different portions of the fluid circuit 190, 290 help the controller 180, 280 control and maintain the heat supply to the fluid circuit 190, 290 and the internal volumes 115, 215 in the processing chambers 100, 200. As a result, the condensation of the processing fluid is prevented and the processing fluid is maintained in the gaseous phase.

The batch processing chamber 100 allows a plurality of substrates to be annealed in batches at the same time under the same conditions, thus reducing the cost of processing each substrate. On the other hand, the single-substrate processing chamber 200 allows more efficient processing of the substrate, thus offering excellent substrate temperature control over each substrate to be annealed. Moreover, the single-substrate processing chamber 200 may be readily integrated with vacuum cluster processing tools, thus providing efficient substrate processing and integration of processing chambers required for device integration.

While the foregoing is directed to particular embodiments of the present disclosure, it is to be understood that these embodiments are merely illustrative of the principles and applications of the present invention. It is therefore to be understood that numerous modifications may be made to the illustrative embodiments to arrive at other embodiments without departing from the spirit and scope of the present inventions, as defined by the appended claims.

What is claimed is:

1. A substrate processing chamber for annealing under high pressure at high temperature comprising:
a chamber body enclosing an internal volume;
a substrate support disposed in the internal volume and configured to support a substrate;

a temperature-controlled fluid circuit configured to deliver a processing fluid to the internal volume;
one or more first heaters interfaced with the temperature-controlled fluid circuit and configured to maintain the processing fluid in the temperature-controlled fluid circuit at a temperature above a condensation point of the processing fluid; and
one or more second heaters interfaced with the chamber body and configured to maintain the processing fluid in the internal volume at a temperature above the condensation point of the processing fluid.

2. The substrate processing chamber of claim 1, further comprising:
one or more first temperature sensors operable to measure a temperature of the temperature-controlled fluid circuit.

3. The substrate processing chamber of claim 2, further comprising:
one or more second temperature sensors operable to measure a temperature of the chamber body.

4. The substrate processing chamber of claim 1, further comprising:
one or more heat shields coupled to the chamber body and disposed in the internal volume.

5. The substrate processing chamber of claim 1, further comprising:
a cooling channel disposed adjacent to a door configured to sealably close the chamber body.

6. The substrate processing chamber of claim 1, wherein the chamber body is fabricated from a nickel-based alloy.

7. The substrate processing chamber of claim 1, wherein the one or more second heaters are operable to maintain the internal volume at a temperature above 300 degrees Celsius.

8. A substrate processing chamber for annealing under high pressure at high temperature comprising:
a chamber body enclosing an internal volume;
a substrate support disposed in the internal volume and configured to support a substrate;
a temperature-controlled fluid circuit configured to deliver a processing fluid to the internal volume;
one or more heaters interfaced with the chamber body;
a power source coupled to the one or more heaters; and
a controller communicatively connected to the power source and configured to, in response to information, control the power source to:
power the one or more heaters to maintain the processing fluid in the internal volume as a superheated dry steam.

9. The substrate processing chamber of claim 8, wherein the information is received by the controller from one or more of:
one or more first temperature sensors operable to measure a temperature of the temperature-controlled fluid circuit; or
one or more second temperature sensors operable to measure a temperature of the chamber body.

10. The substrate processing chamber of claim 8, further comprising:
one or more heat shields coupled to the chamber body and disposed in the internal volume.

11. The substrate processing chamber of claim 8, further comprising:
a cooling channel disposed adjacent to a door configured to sealably close the chamber body.

12. The substrate processing chamber of claim 8, wherein the controller is configured to, in response to the information, control the power source to power the one or more heaters to maintain the internal volume at a temperature above 300 degrees Celsius.

13. The substrate processing chamber of claim 8, further comprising one or more heaters interfaced with the temperature-controlled fluid circuit and coupled to the power source, wherein the controller is configured to, in response to the information, control the power source to power the one or more heaters interfaced with the temperature-controlled fluid circuit to maintain the processing fluid in the temperature-controlled fluid circuit at a temperature above a condensation point of the processing fluid.

14. The substrate processing chamber of claim 13, wherein the controller is configured to, in response to the information, control the power source to power the one or more heaters interfaced with the temperature-controller fluid circuit to maintain the processing fluid in the temperature-controlled fluid circuit as a dry steam.

15. A substrate processing chamber for annealing under high pressure at high temperature comprising:
a chamber body enclosing an internal volume;
a substrate support disposed in the internal volume and configured to support a substrate;
a temperature-controlled fluid circuit configured to deliver a processing fluid to the internal volume; and
a condenser fluidly connected to the internal volume and configured to condense the processing fluid.

16. The substrate processing chamber of claim 15, further comprising:
one or more first heaters interfaced with the temperature-controlled fluid circuit and configured to maintain the processing fluid in the temperature-controlled fluid circuit at a temperature above a condensation point of the processing fluid.

17. The substrate processing chamber of claim 16, further comprising:
one or more second heaters interfaced with the chamber body and configured to maintain the processing fluid in the internal volume at a temperature above the condensation point of the processing fluid.

18. The substrate processing chamber of claim 17, wherein the one or more second heaters are operable to maintain the internal volume at a temperature above 300 degrees Celsius.

19. The substrate processing chamber of claim 15, further comprising:
one or more heat shields coupled to the chamber body and disposed in the internal volume.

20. The substrate processing chamber of claim 15, wherein the condenser is fluidly connected to the internal volume through the temperature-controlled fluid circuit.

* * * * *